United States Patent [19]
Ebel

[11] Patent Number: 6,160,733
[45] Date of Patent: *Dec. 12, 2000

[54] LOW VOLTAGE AND LOW POWER STATIC RANDOM ACCESS MEMORY (SRAM)

[75] Inventor: Mark S. Ebel, Los Altos, Calif.

[73] Assignee: Enable Semiconductor, Inc., Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/920,682

[22] Filed: Aug. 29, 1997

[51] Int. Cl.$^7$ .................................................. G11C 11/00
[52] U.S. Cl. ........................... 365/154; 365/203; 365/194
[58] Field of Search .................................... 365/154, 201, 365/233.5, 203, 194, 233

[56] References Cited

U.S. PATENT DOCUMENTS

| | | | |
|---|---|---|---|
| 4,380,805 | 4/1983 | Proebsting | 365/201 |
| 4,894,803 | 1/1990 | Aizaki | 365/189.05 |
| 4,975,877 | 12/1990 | Bell | 365/189.01 |
| 5,070,482 | 12/1991 | Miyaji | 365/230.06 |
| 5,198,708 | 3/1993 | Gillingham | 307/480 |
| 5,313,435 | 5/1994 | Kim et al. | 365/233.5 |
| 5,341,341 | 8/1994 | Fukuzo | 365/233 |
| 5,452,246 | 9/1995 | Kawashima | 365/154 |
| 5,544,097 | 8/1996 | McClure et al. | 365/154 |
| 5,548,560 | 8/1996 | Stephen, Jr. et al. | 365/233.5 |
| 5,555,208 | 9/1996 | Nishihara | 365/154 |
| 5,600,589 | 2/1997 | Ishigaki et al. | 365/154 |
| 5,715,212 | 2/1998 | Tanida et al. | 365/233.5 |

FOREIGN PATENT DOCUMENTS

| | | |
|---|---|---|
| 0-525270 | 2/1993 | European Pat. Off. . |
| 2-134798 | 5/1990 | Japan . |

OTHER PUBLICATIONS

Cypress 32K×8 Static RAM Preliminary Data Sheet CY62256V, Cypress Semiconductor Corp., Revised May 1996, pp. 1–7.

*Primary Examiner*—David Nelms
*Assistant Examiner*—David Lam
*Attorney, Agent, or Firm*—Carr & Ferrell LLP

[57] ABSTRACT

A static random access memory having a static random access memory cell array, row address buffers for receiving row address signals, and column address buffers for receiving column address signals. The static random access memory also includes a clock chain circuit connected to the row address buffers and column address buffers such as to be responsive to transitions in the row address signals and column address signals by generating clock signals for accessing the static random access memory cell array. A method for accessing a static random access memory comprising detecting a transition occurring in a row address signal for addressing a static random access memory cell array; generating a plurality of clock signals in response to the transition in the row address signal; and accessing the static random access memory cell array.

23 Claims, 17 Drawing Sheets

Column Precharge Clock Generator
(in clock chain circuit 165, Fig. 1)

LOW VOLTAGE AND LOW POWER STATIC RANDOM ACCESS MEMORY (SRAM)

RELATED PATENT APPLICATIONS

This patent application is commonly owned with the following copending related patent applications: (i)patent application entitled "ROM Bit Sensing" to Callahan and having Ser. No. 08/886,616, filed Jul. 1, 1997; (ii) patent application entitled "Digital Circuit for Conserving Static Current in an Electronic Device" to Callahan and having Ser. No. 08/886,620, filed Jul. 1, 1997; and (iii) patent application entitled "Voltage Source and Memory Voltage Switch in a Memory Chip" to Ebel et al and having Ser. No. 08/873,445, filed Jun. 12, 1997. All of the foregoing copending related patent applications (i.e. patent applications having Ser. Nos. 08/886,616, 08/886,620, and 08/873,445) are fully incorporated herein by reference thereto as if repeated verbatim immediately hereinafter

BACKGROUND OF THE INVENTION

1. Field of the Invention

The present invention relates generally to semiconductor memories and more specifically to a low voltage and low power static random access memory (SRAM)

2. Description of the Background Art

Digital devices are constantly becoming more pervasive in numerous applications, such as personal computers, telecommunications, consumer electronics, and the like. Consequently, the use of digital memory also constantly increases. By far, the most widely used type of semiconductor memory is the dynamic-random-access memory (DRAM). DRAMs, due to their high packing density and resulting small device footprint for a given number of memory locations, provide a low cost memory alternative. However, DRAMs require a great deal of overhead circuitry, including circuits to periodically refresh the state of each of the DRAM bit cells and thereby retain stored data.

Another widely used memory alternative is the static random access memory (SRAM). SRAMs do not require refresh circuitry, are more easily integrated into other devices and systems, and generally have a faster access time than many other memory device alternatives. However, SRAMs have a lower packing density, a larger resulting device footprint for a given number of memory locations and thus, a higher cost per memory size than, for example, DRAMs. SRAMs therefore tend to be more widely used where, for example, avoidance of system complexity (due to refresh circuitry and/or other characteristics of memory device alternatives) justifies their higher cost.

While thus desirable due to easy integration and other factors, SRAM use is limited based upon source voltage and power consumption requirements. One reason is portability. Reduced electrical requirements would allow portable systems containing SRAM, such as pagers, hand-held global positioning systems (GPS) and pacemakers (to name just a few examples), to utilize a lower voltage power supply and/or utilize a given power supply (e.g., a battery) for a longer period.

Reduced electrical requirements would further allow a given power supply to support an increased amount of SRAM. This would result in an application-oriented system utilizing some general purpose components (e.g., microcontrollers or microprocessors) which can store more instructions, can have greater functionality, and/or can store more data. A pager, for example, might thus be able to support transmission of volumes of text and/or other media A GPS might store a planned trip, directions traveled, etc. A pacemaker might record and/or accommodate specific scenarios, perform self testing, call a doctor, etc. Numerous other general and special-purpose systems would also benefit for these and other reasons.

Until recently, conventional SRAMs have provided a typical operating range of 2.7 v<VCC<3.6 v. More recently, however, methods such as element-size reduction, process reduction and final test sorting have been utilized with increasing frequency and with some success. Element-size reduction includes, for example, decreasing the size of the transistor channel, thereby reducing the electrical requirements for transistor operation. Similarly, process reduction involves decreasing the geometry of some, most or even all electrical elements by further optimizing processing techniques. Final test sorting involves testing devices produced at tighter tolerances than standard devices for specific characteristics. Due to process variations, certain devices will tend to have certain characteristics that are enhanced while other characteristics (hopefully, less important ones) might be less ideal. Thus, devices with lower voltage and/or power requirements might be found by testing for these specific characteristics.

Through these increasingly utilized conventional techniques, devices having voltages as low as 1.8 v (and some with desirable power reductions) have been made available in some quantity. Unfortunately, these techniques have limitations. Geometry reduction techniques can be extremely expensive and are subject to physical limitations with respect to tooling and process capabilities, device functionality, interoperability, and/or containment, as well as other factors. Final test sorting typically produces only a limited yield, at additional expense and often with a compromise in other desirable device characteristics. As with geometry reduction, final test sorting will provide limited improvement beyond which these and/or other undesirable consequences will result.

Thus, a new approach is required to further lower the VCC operating range of SRAM systems.

Therefore, what is needed and what has been invented is a low voltage and low power memory system which operates at lower voltage levels than currently known technology, and which would overcome the foregoing deficiencies.

SUMMARY OF THE INVENTION

The present invention broadly accomplishes its desired objects by providing a low power and low voltage SRAM device including a static random access memory cell array, row address buffers for receiving row address signals, and column address buffers for receiving column address signals. A clock chain circuit is connected to the row address buffers and to the column address buffers such as to be responsive to transitions in the row address signals and in the column address signals by generating clock signals for accessing the static random access memory cell array.

Since a SRAM device is constructed with fairly thin inter-level oxides, low voltages, as provided by the present invention, enable reduced stress on the oxides, thereby reducing degradation and improving SRAM reliability and operating life. The present invention enables the use of voltage and power reduction in other memory devices, including those memory devices that are capable of incorporating SRAM.

The present invention also broadly accomplishes its desired objects by broadly providing a method for accessing a static random access memory comprising the steps of: (a) detecting a transition occurring in a row address signal for addressing a static random access memory cell array; (b) generating a plurality of clock signals in response to the transition in the row address signal; and (c) accessing the static random access memory cell array.

It is therefore an object of the present invention to provide a static random access memory.

It is another object of the present invention to provide a method for accessing a static random access memory.

These, together with the various ancillary advantages and features which will become apparent to those skilled in the art as the following description proceeds, are attained by these novel circuits and methods, a preferred embodiment thereof shown with reference to the accompanying drawings, by way of example only, wherein:

DETAILED DESCRIPTION OF PREFERRED EMBODIMENTS OF THE INVENTION

Figure 1:
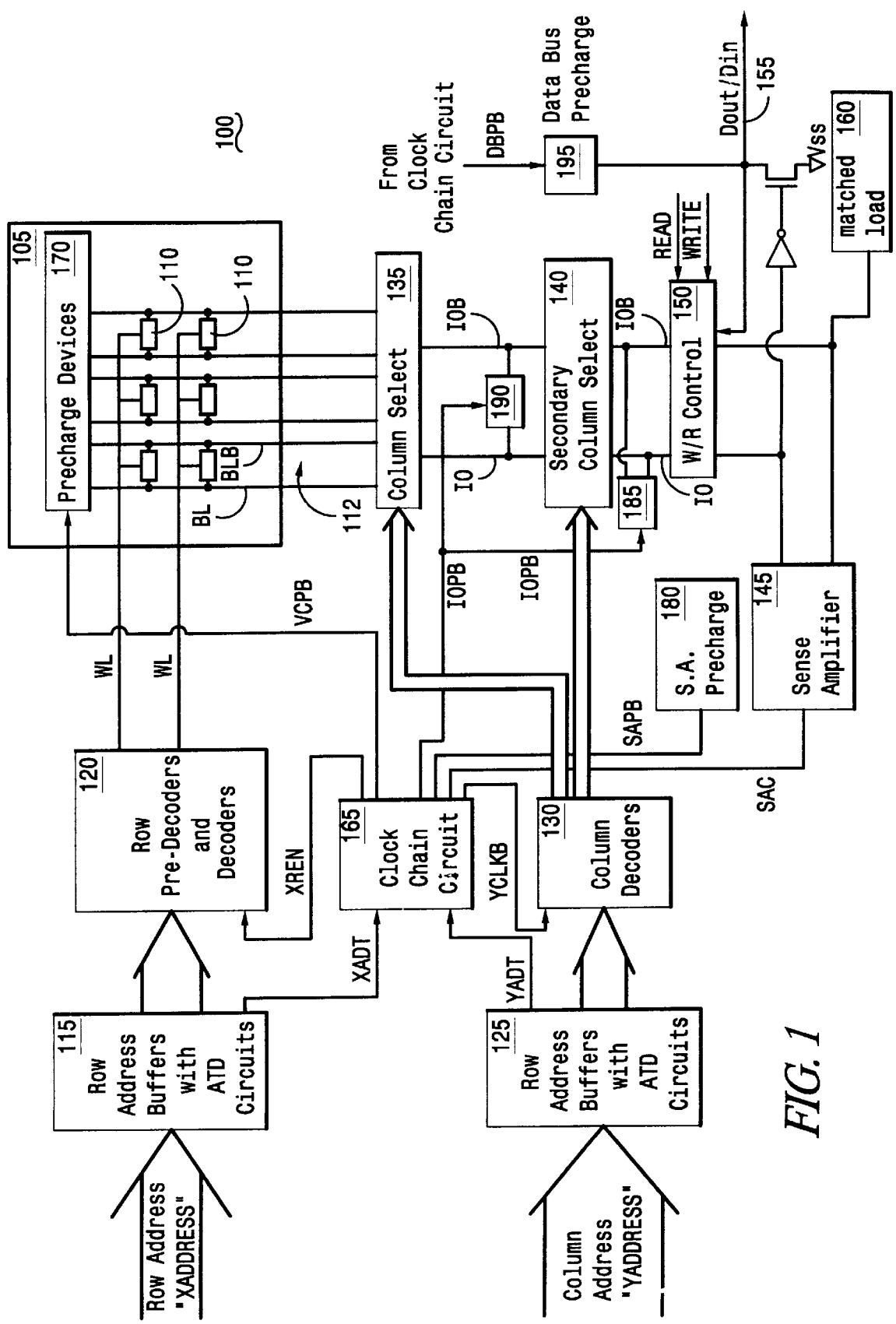
FIG. 1 is a schematic block diagram of a low power and low voltage static random access memory (SRAM) device according to a preferred embodiment of the present invention.

Referring in detail now to the drawings wherein similar parts of the present invention are identified by like reference numerals, there is seen in FIG. 1 a low voltage and low power static random access memory (SRAM) device, generally illustrated as 100, which is capable of implementing the present invention. An exemplary low power/low voltage SRAM device 100 is commercially available from Enable Semiconductor, Inc., 1740 Technology Drive, Suite 110, San Jose, Calif. 95110, for example, under the part number "ES62ULL256-45." The SRAM device 100 includes a memory cell array 105 configured with a plurality of memory cells 110. Each memory cell 110 stores a binary bit "1" or "0" of data, and is positioned at the intersections of a plurality of wordlines WL and of a plurality of complimentary bitlines pair, BL and BLB. In addition, each pair of BL and BLB bitlines further defines a column 112. The specific operation of a memory cell 110 is discussed hereinbelow with particular reference to FIG. 8.

The row address buffers stage 115 performs buffering of the externally supplied row address signals, XADDRESS. The output of the row address buffers stage 115 is driven into a row decoder stage 120 which includes row pre-decoders and row decoders. In response to the XADDRESS row address signals, the row decoder stage 120 applies positive voltage (for example, about 1.2 v to about 3.6 v) to a selected WL wordline for addressing a memory cell 110.

The externally supplied column address signals, YADDRESS, are buffered by the column address buffers stage 125. The output of the column address buffers stage 125 is driven into column decoders 130. In response to the YADDRESS column address signals, the column decoders 130 drives the column select 135 or the secondary column select 140 to select the appropriate column 112.

The sense amplifier 145 amplifies the data which is read out from a memory cell 110. In response to the read enable (READ) signal, the write/read (W/R) control circuit 150 permits output data, $D_{OUT}$, to be driven as output from the data bus 155 by connecting the IO and IOB data lines to the sense amplifier 145. In response to the write enable (WRITE) signal, the write/read control circuit 150 permits the input data, $D_{IN}$, for input from the data bus 155 to the memory cell array 105 by connecting the IO and IOB data lines to a conventional data input buffer (not shown in FIG. 1). Additionally, a matched load 160 is also coupled to an output of the sense amplifier 145.

The row address buffers stage 115 further includes row address transition detection (ATD) circuits for detecting the change in logic levels of the XADDRESS row address signals, while the column address buffers stage 125 further includes column ATD circuits for detecting the change in logic levels of the YADDRESS column address signals. In response to a row address transition, at least one XATD signal is generated and driven into a clock chain circuit 165. In response to a column address transition, at least one YATD signal is generated and driven into the clock chain circuit 165.

In response to the XATD clock signal, the clock chain circuit 165 generates various clocks signals such as the XSTART clock signal (see FIG. 2) which in turn generates VCPB column precharge clock for turning on the column precharge device 170 which precharges the BL and BLB bitlines. The XSTART clock signal also generates the XREN clock signal which is driven into the row decoder stage 120 for pulling down the WL wordlines prior to or during precharging of the BL and BLB bitlines pairs In addition, the XSTART clock signal generates the VCP clock signal (see FIG. 13). The VCP clock signal, in turn, generates the following clock signals: (1) the SAPB sense amplifier precharge clock for turning on the sense amplifier precharge device 180 which precharges the sense amplifier 145, (2) the SAC sense amplifier clock for turning on the sense amplifier 145 after all bitlines, BL and BLB, have been charged and after a proper WL wordline and column 112 have been selected, and (3) the IOPB precharge clock for turning on the precharge devices 185 and 190 which precharges the IO and IOB lines.

Additionally, a DBPB data bus precharge clock signal for turning on the data bus precharge device 195 is generated by the SAPB clock and when the WRITE signal is low.

In response to a YATD clock signal, the clock chain circuit 165 also generates the YSTART clock signal (see FIG. 3) which, in turn, generates the following clock signals: SAPB, SAC, IOPB, and DBPB.

Figure 2:
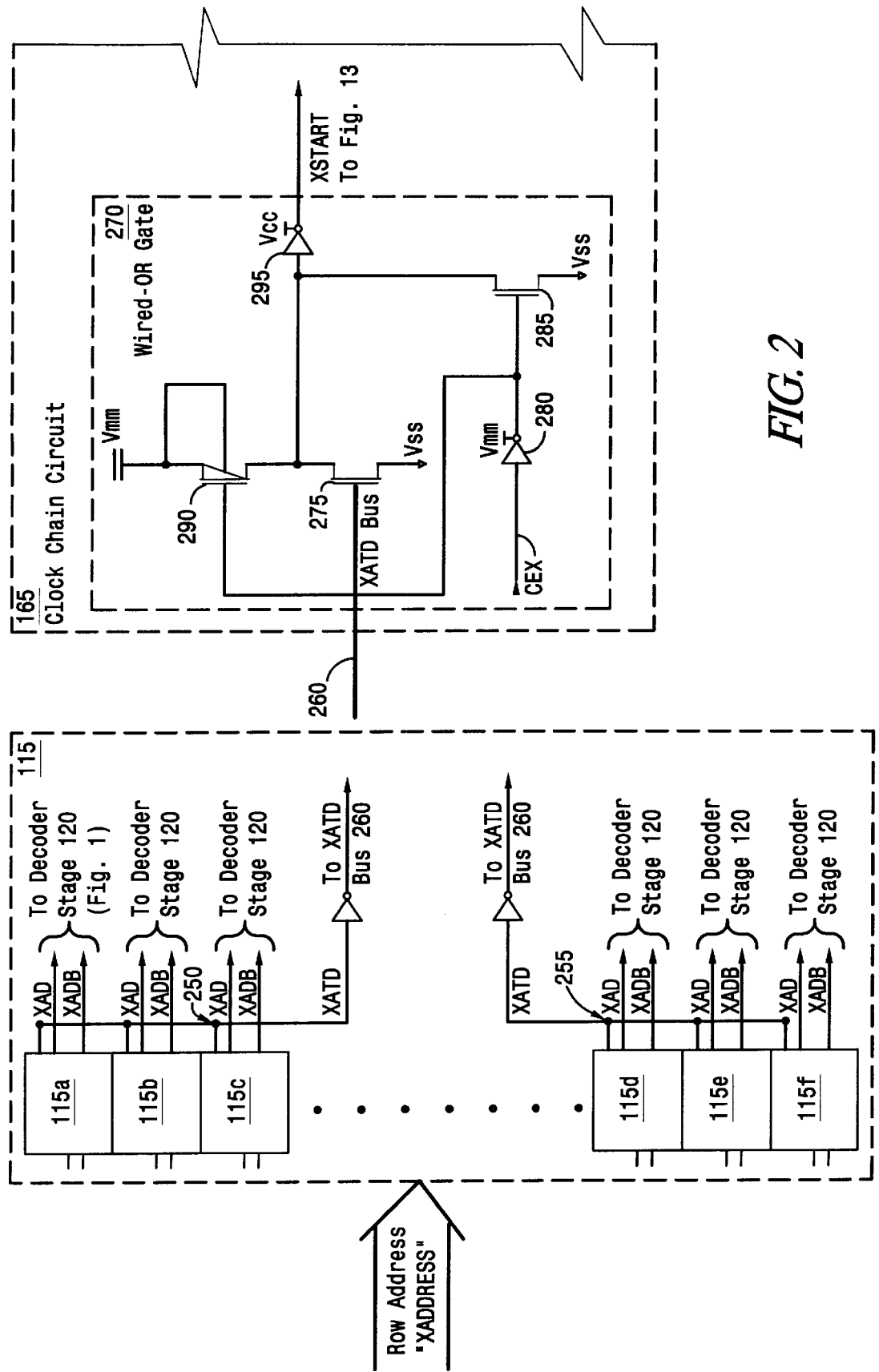
FIG. 2 is a schematic block diagram of the row address buffer stage of FIG. 1 including ATD circuits and the wired-OR gate for generating the XSTART clock signal.

Referring now to FIG. 2, the row address buffers stage 115 is shown in additional detail according to a preferred embodiment of the present invention. The row address buffers 115a, 115b, and 115c drive the XAD and XADB address signals to the row decoder stage 120 (see FIG. 1). Similarly, the row address buffers 115d, 115e, and 115f drive the XAD and XADB address signals to the row decoder stage 120 (see FIG. 1). The structure and operation of a row address buffer is discussed hereinbelow with particular reference to FIG. 4.

The row address buffers 115a, 115b, and 115c each generates row address transition signals (not shown in FIG. 2) which are wired-OR at node 250 to produce an XATD signal. Similarly, the row address buffers 115d, 115e, and 115f each generates row address transition signals (not shown in FIG. 2) which are wired-OR at node 255 to produce another XATD signal.

FIG. 2 illustrates only a portion of the row address buffers stage 115. Additional row address buffers may be included in the stage 115 and are represented by ellipses shown in FIG. 2. These additional buffers also generate the XAD, XADB, and XATD signals.

All XATD signals in row address stage 115 are then driven into an XATD bus 260 which forms an input terminal of a wired-OR gate 270. The XATD bus 260 is coupled to the gate of an n-channel transistor 275. The n-channel transistor 275 has its source connected to the VSS reference voltage source which is typically at ground. An inverter 280 has an input terminal for receiving the CEX chip enable signal which is generated by the VCCEN enable signal (see FIG. 7) for permitting reading and writing operations to the memory cell matrix 105 (see FIG. 1). The output terminal of the inverter 280 is connected to the gate of an n-channel transistor 285 and to the gate of a p-channel transistor 290. The source of the n-channel transistor 285 is connected to VSS, while the source and bulk (substrate connection) of the p-channel transistor 290 are connected to the VMM memory voltage source, which is typically equal to the VCC external voltage supply source. The drains of the transistors 275, 285, and 290 are connected together and are also connected to the input terminal of an inverter 295. The output terminal of the inverter 295 is configured to output the XSTART clock signal or pulse. Wired-OR gates are further shown and described in Horowitz, Paul and Hill, Winfield, *The Art Of Electronics* (2nd ed.), Cambridge University Press, New York, N.Y. (1996), which is fully incorporated herein by reference thereto as if repeated verbatim immediately hereinafter.

The VMM memory voltage is typically connected to VCC which is commonly referred to as the system level voltage because, as well known in the art, VCC is the supply voltage typically connected to other areas of a chip containing the memory cell array 105 (see FIG. 1), as well as other related circuitry such as decoders, buffers, and the like. The VCC voltage source is typically a power supply external to SRAM memory device of the present invention. As an option, the VMM memory voltage may also be drawn from a VBAT voltage source housed within the memory package, as described in commonly-assigned U.S. patent application Ser. No. 08/873,445, to Ebel et al., filed Jun. 12, 1997, and entitled VOLTAGE SOURCE AND MEMORY-VOLTAGE SWITCH IN A MEMORY CHIP, fully incorporated herein by reference thereto as if repeated verbatim immediately hereinafter.

Figure 3:
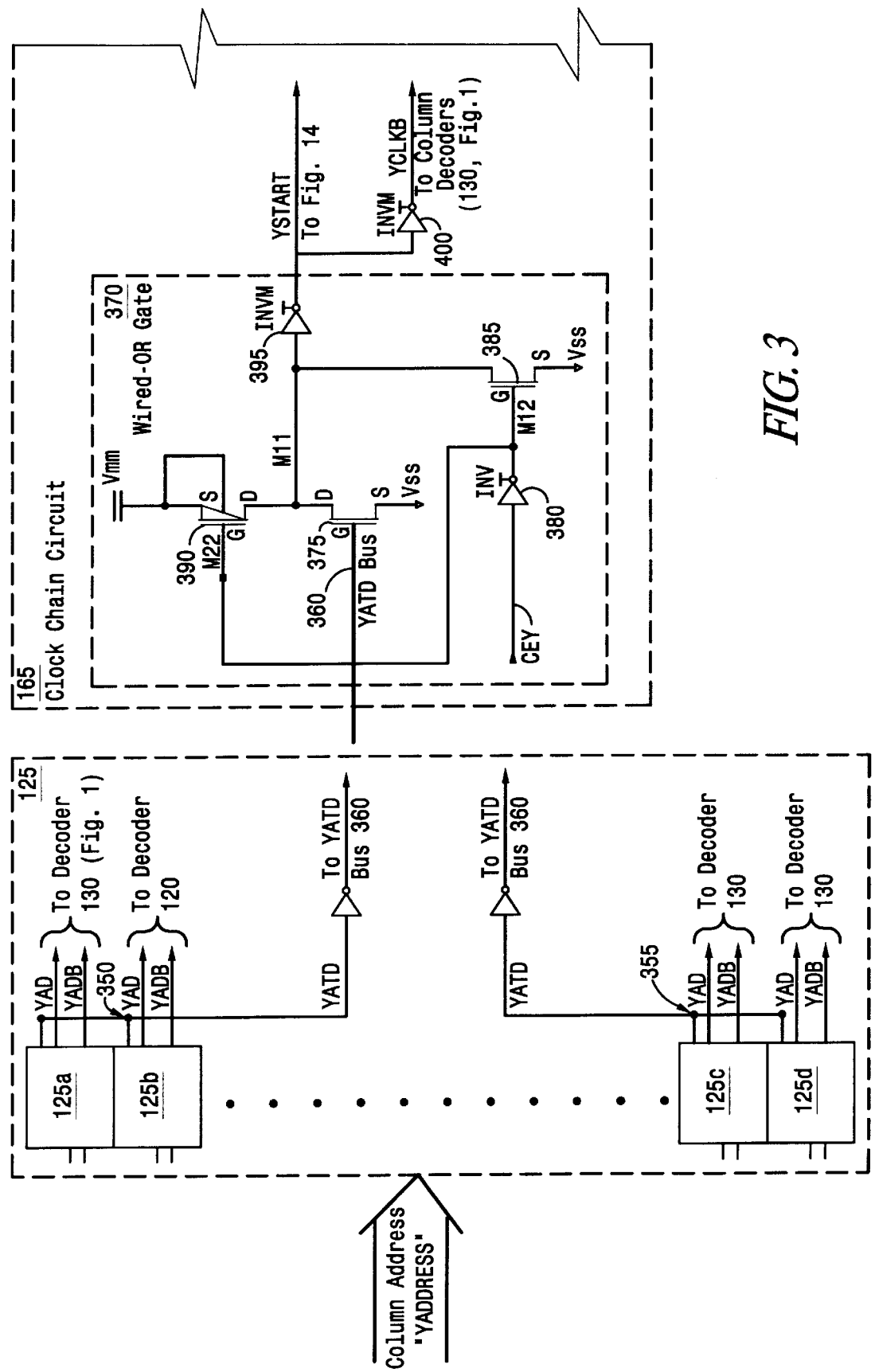
FIG. 3 is a schematic block diagram of the column address buffer stage of FIG. 1 including ATD circuits and the wired-OR gate for generating the YSTART and YCLKB clock signals.

Referring now to FIG. 3, the column address buffers stage 125 is shown in additional detail according to a preferred embodiment of the invention. The column address buffers 125a and 125b drive the YAD and YADB address signals to the column decoder stage 130 (see FIG. 1). Similarly, the column address buffers 125c and 125d drive the YAD and YADB address signals to the column decoder stage 130 (see FIG. 1). The structure and operation of a column address buffer is discussed hereinbelow with particular reference to FIG. 6.

The column address buffers 125a and 125b each generates column address transition signals (not shown in FIG. 3) which are wired-OR at node 350 to produce a YATD signal. Similarly, the column address buffers 125c and 125d each generates column address transition signals (not shown in FIG. 3) which are wired-OR at node 355 to produce another YATD signal.

FIG. 3 illustrates only a portion of the column address buffers stage 125. Additional column address buffers may be included in the stage 125 and are represented by ellipses shown in FIG. 3. These additional buffers also generate the YAD, YADB, and YATD signals.

All YATD signals in column address stage 125 are then driven into a YATD bus 360 which forms an input terminal of a wired-OR gate 370. The YATD bus 360 is coupled to the gate of an n-channel transistor 375. The n-channel transistor 375 has its source connected to the VSS reference voltage source which is typically at ground. An inverter 380 has an input terminal for receiving the CEY chip enable signal which is generated by the VCCEN enable signal (see FIG. 7) for permitting reading and writing operations to the memory cell matrix 105 (see FIG. 1). The output terminal of the inverter-380 is connected to the gate of an n-channel transistor 385 and to the gate of a p-channel transistor 390. The source of the n-channel transistor 385 is connected to VSS, while the source and bulk (substrate connection) of the p-channel transistor 390 are connected to the VCC supply voltage source. The drains of the transistors 375, 385, and 390 are connected together and are also connected to the input terminal of an inverter 395. The output terminal of the inverter 395 is configured to output the YSTART clock signal or pulse. An inverter 400 inverts the YSTART clock to generate the YCLKB negative clock signal which is driven into the column decoder stage 130 (see FIG. 1) such that all columns 112 (see FIG. 1 again) are deselected by the column select 135 (see FIG. 1 again) prior to or during precharging of the BL and BLB bitlines pairs.

Figure 4:
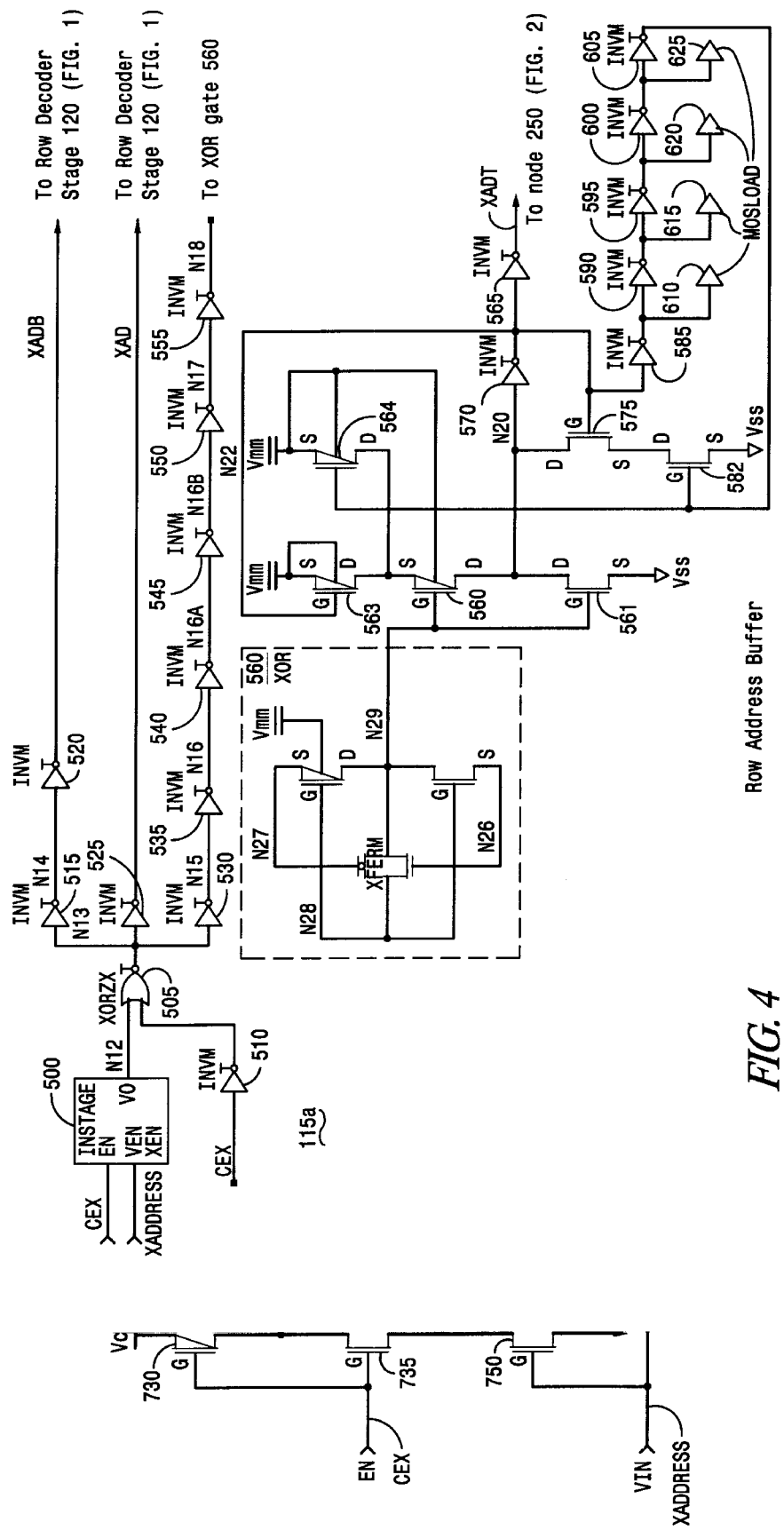
FIG. 4 is a schematic circuit diagram which shows the details of a row address buffer in FIG. 2.

FIG. 4 is a schematic circuit diagram of a row address buffer (e.g., buffer 115*a*) in FIG. 2 according to a preferred embodiment of the invention. An input stage 500 has an input terminal for receiving the CEX chip enable signal, and has another input terminal for receiving the XADDRESS row address signals. The structure and operation of the input stage 500 is discussed hereinbelow with particular reference to FIG. 6.

The output terminal of the input stage 500 is connected to a first input terminal of a NOR gate 505. The second input terminal of the NOR gate 505 is configured to receive the CEX chip enable signal via inverter 510. The output terminal of the NOR gate 505 is connected to the row decoder stage 120 (FIG. 1) via inverters pair 515 and 520 for driving the XADB signal, and via inverter 525 for driving the XAD signal. The output terminal of the NOR gate 505 is also connected to an input terminal of a delay chain including inverters 530, 535, 540, 545, 550, and 555.

The output terminal of the delay chain (i.e., the inverter 555 output terminal) is connected to an input of an XOR gate 560. The output terminal of the XOR gate 560 is connected to the gate of an n-channel transistor 561 and to the gate of a p-channel transistor 562. The p-channel transistors 563 and 564 provide the switching necessary to minimize current spikes for the XATD pulse signal.

The XATD pulse is generated at the output terminal of inverter 565. A latch (comprising the inverter 570 and the p-channel transistor 575) sharpens the edges of the XATD pulse output. A circular timing chain 580 comprising n-channel transistor 582, and a plurality of inverters and capacitive loads provides delay for setting the width of the XATD pulse. In FIG. 4, inverters 585, 590, 595, 600, and 605, and loads 610, 615, 620, and 625 form in the timing chain 580. The loads shown in FIG. 4 are typically capacitive loads.

Figure 5:
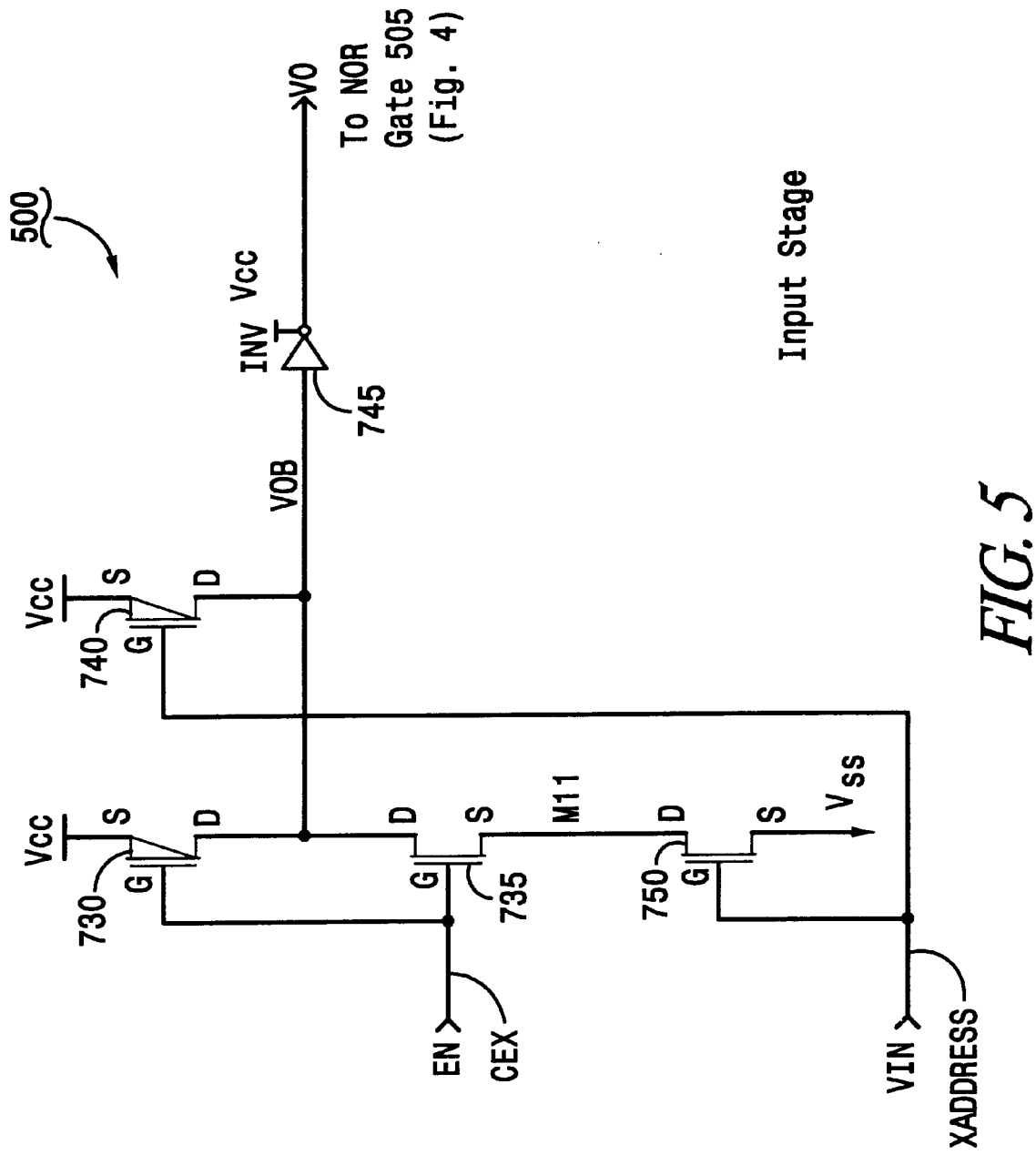
FIG. 5 is a schematic circuit diagram which shows the details of the input stage of FIG. 4.

FIG. 5 shows the details of the input logic stage 500 in Fig. .4. The gates of a p-channel transistor 730 and of an n-channel transistor 735 are configured to receive the CEX chip enable signal. The drains of p-channel transistors 730 and 540 are connected to the VCC supply voltage source, while the drains of the transistors 730, 735, and 740 are connected to the input terminal of an inverter 745. The output terminal of the inverter 745 is connected to the first input terminal of the NOR gate 505 (see FIG. 4). The gates of the p-channel transistor 740 and of an n-channel transistor 750 receive the XADDRESS row address signals. The n-channel transistor 750 has its drain connected to the source of the n-channel transistor 535, and has its source connected to VSS.

Figure 6:
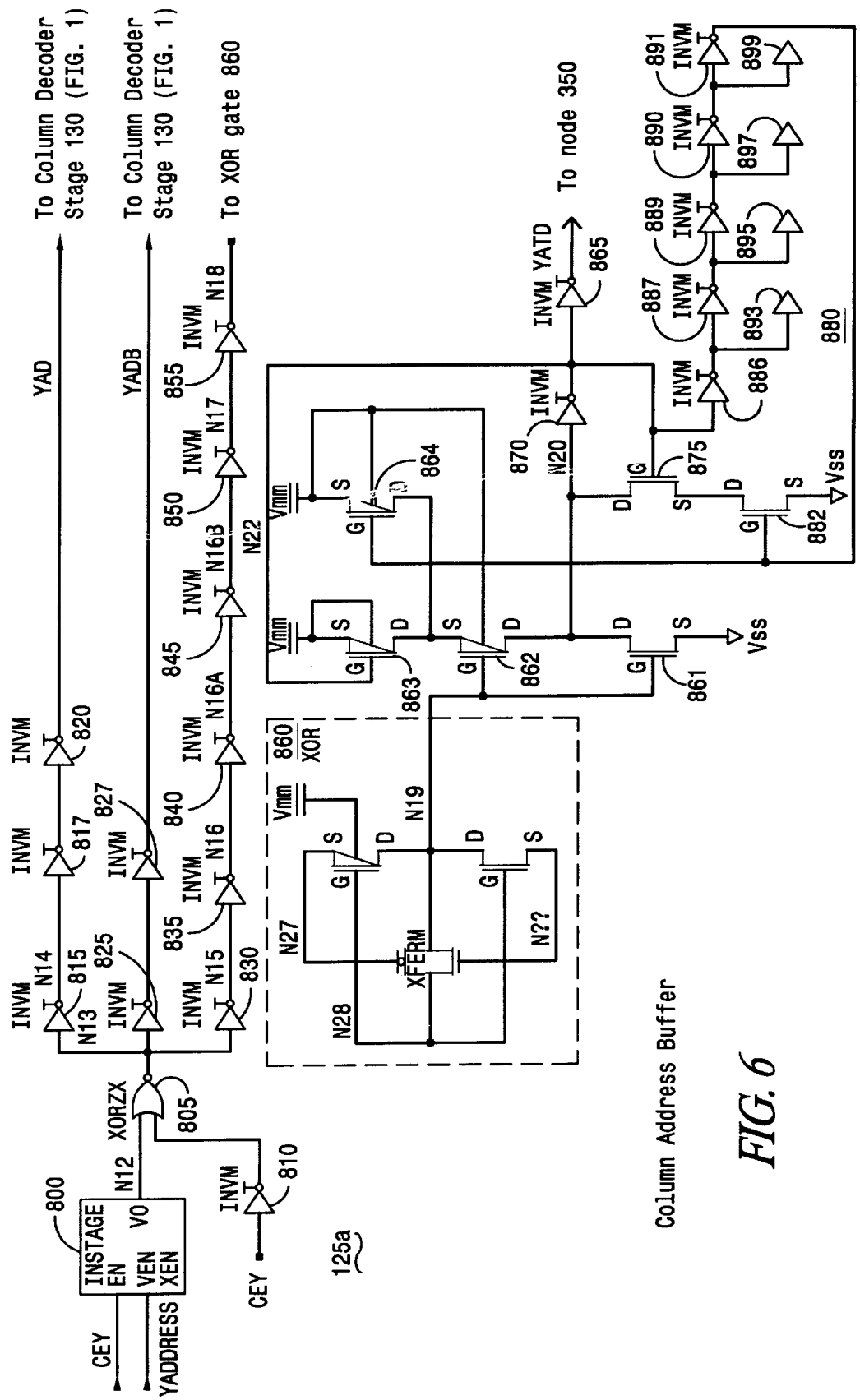
FIG. 6 is a schematic circuit diagram which shows the details of a column address buffer in FIG. 3.

Referring now to FIG. 6, a schematic circuit diagram of the column address buffer 125*a* is shown according to a preferred embodiment of the invention. An input logic stage 800 has an input terminal for receiving the CEY chip enable signal, and has another input terminal for receiving the YADDRESS column address signals. The output terminal of the input logic stage 800 is connected to a first input terminal of a NOR gate 805. The second input terminal of the NOR gate 805 is configured to receive the CEY chip enable signal via inverter 810. The output terminal of the NOR gate 805 is connected to the column decoder stage 130 (see FIG. 1) via inverters 815, 817 and 820 to generate the YAD signal, and via inverters pair 825 and 827 to generate the YADB signal. The output terminal of the NOR gate 805 is also connected to an input terminal of a delay chain including inverters 830, 835, 840, 845, 850, and 855. The output terminal of the delay chain (i.e., the inverter 855 output terminal) is connected to an input of an XOR gate 860. The output terminal of the XOR gate 860 is connected to the gate of an n-channel transistor 861 and to the gate of a p-channel transistor 862. The p-channel transistors 863 and 864 provide the switching necessary to minimize current spikes for the YATD pulse signal.

The YATD column address transition detection pulse is generated at the output terminal of inverter 865. A latch (comprising the inverter 870 and the p-channel transistor 875) sharpens the edges of the YATD pulse output. A circular timing chain 880 comprising the n-channel transistor 882, and a plurality of inverters and capacitive loads provides delay for setting the width of the YATD pulse. In FIG. 6, inverters 886, 887, 889, 890, and 891, and loads 893, 895, 897, and 899 form in the timing chain 880.

Figure 7:
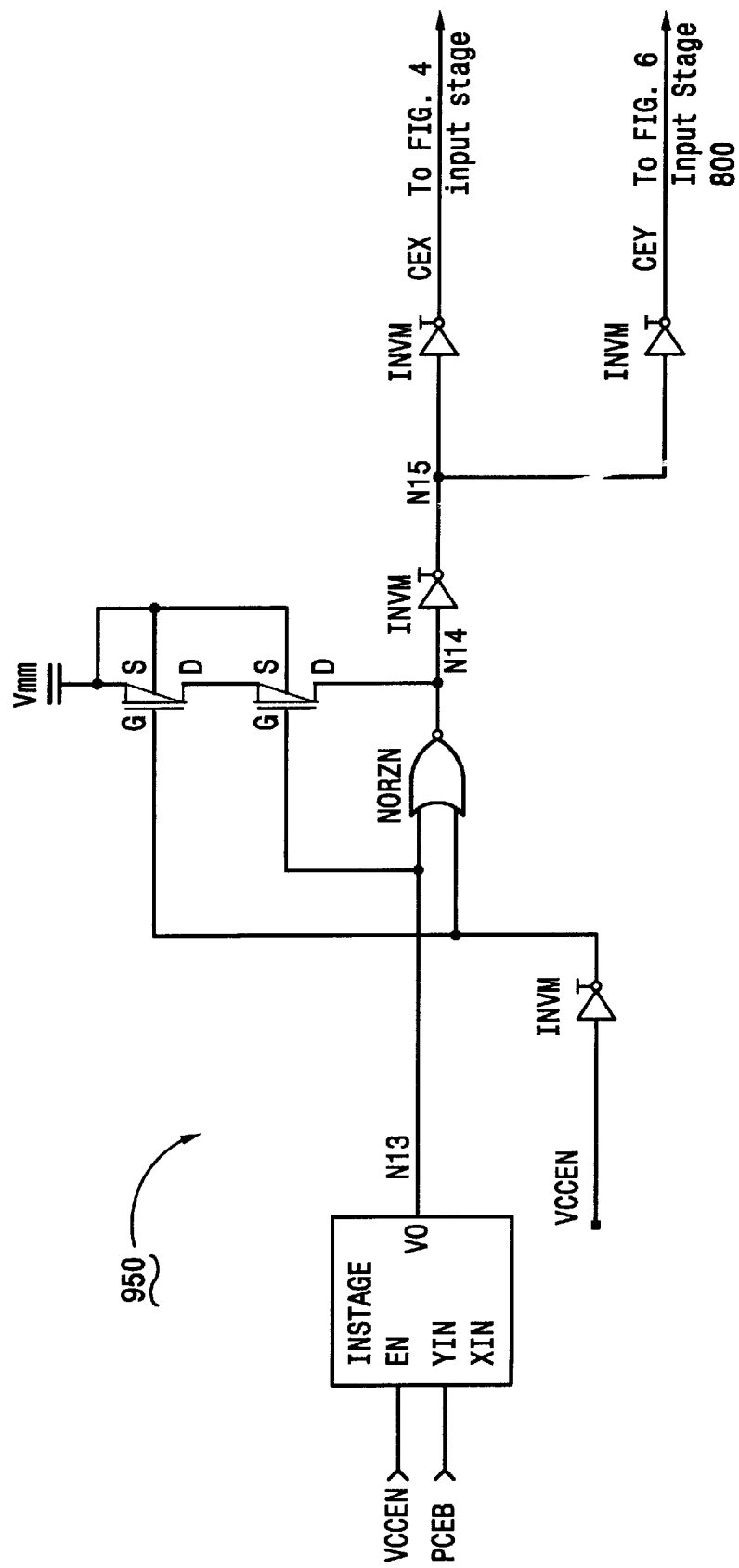
FIG. 7 is a schematic block diagram of a circuit which generate CEX and CEY enable signals from a VCCEN enable signal, and which permits reading and writing operations to a memory cell matrix, according to the present invention.

FIG. 7 is a schematic diagram of a circuit 950 which generates the CEX enable signal that is driven into input stage 500 (see FIG. 4), and the CEY enable signal which is driven into the input stage 800 (see FIG. 6). The CEX and CEY enable signals are triggered by the VCCEN enable signal which permits reading and writing operations to the memory cell matrix 105 (see FIG. 1).

Figure 8:
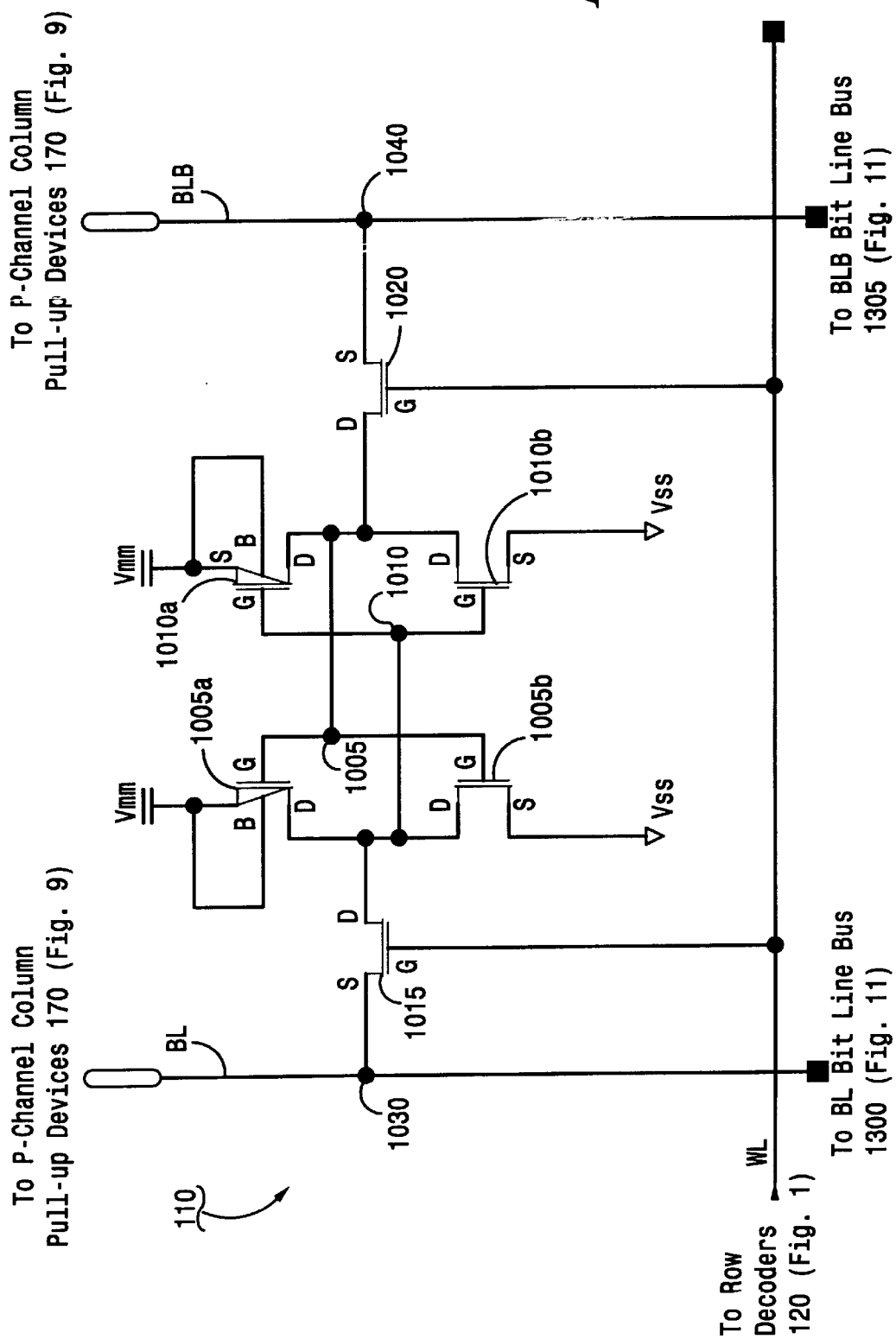
FIG. 8 is a schematic circuit diagram of a 6-T (six transistors) memory bit cell according to the present invention.

Reference is now made to FIG. 8 which shows a schematic circuit diagram of a memory cell 110 in FIG. 1. The memory cell 110 may have the conventional 6-T configuration which includes cross-coupled inverters 1005 and 1010. As known to those skilled in the art, the memory bit cells 110 are conceptually, and usually physically, arranged in a plurality of columns and a plurality of rows to form the memory cell array 105 (see FIG. 1). The inverter 1005 includes the p-channel transistor 1005*a* and the n-channel transistor 1005*b,* while the inverter 1010 includes the p-channel transistor 1010*a* and the n-channel transistor 1010*b.* The pass gate transistor 1015 has its drain connected to the drains of p-channel transistor 1005*a* and of n-channel transistor 1005*b,* and has its source connected to a bit line, BL, at node 1030, and has its gate connected to a particular wordline WL. The pass gate transistor 1020 has its drain connected to the drains of p-channel transistor 1010*a* and of n-channel transistor 1010*b,* and has its source connected to a bitline, BLB, at node 1040, and has its gate connected to the particular WL wordline. When the signal in the WL wordline is activated by the row decoders 120 (see FIG. 1), the pass gate transistors 1015 and 1020 are turned on, thereby connecting the node 1030 to the BL bitline and connecting the node 1040 to the BLB bitline. When the signal on the WL wordline is inactive, the pass gate transistors 1030 and 1040 are turned off and the memory bit cell 110 is isolated from the rest of the memory chip circuit.

As known to those skilled in the art, nodes 1030 and 1040 maintain stable voltages which indicate the state of the memory bit cell 110 until a switching voltage is supplied between the nodes 1030 and 1040. According to the invention, the VMM power supply voltage can range from about 1.0 volts to about 4.0 volts Typically, VMM can range from about 1.2 volts to about 3.6 volts.

Assuming VMM is at about 3.6 volts during operation, one of the nodes 1030 and 1040 will be at about 0 volts, while the other is at about 3.6 volts. By convention, the memory bit cell 110 is considered to store a digital "zero" bit when its node 1030 is at 0 volts and its node 1040 is at 3.6 volts. The memory bit cell 110 is considered to store a "one" bit when its node 1030 is at 3.6 volts and its node 1040 is at 0 volts. When in one of these two stable states, the circuit is switched to the other state by driving the high voltage node to 0 volts and applying a short pulse of 3.6 volts to the zero voltage node. Once that pulse is terminated, the state of the cell remains unchanged until another such state reversing voltage pulse is applied between the nodes 1030 and 1040. The immediate foregoing operation assumes that the transistors which forms the inverters 1005 and 1010 remain powered. SRAM memory cells are also further shown and described in U.S. Pat. No. 4,975,877, which is which is fully incorporated herein by reference thereto as if repeated verbatim immediately hereinafter. As stated above, the XSTART and YSTART pulses generate various clock signals in the memory system according to the invention.

Figure 9:
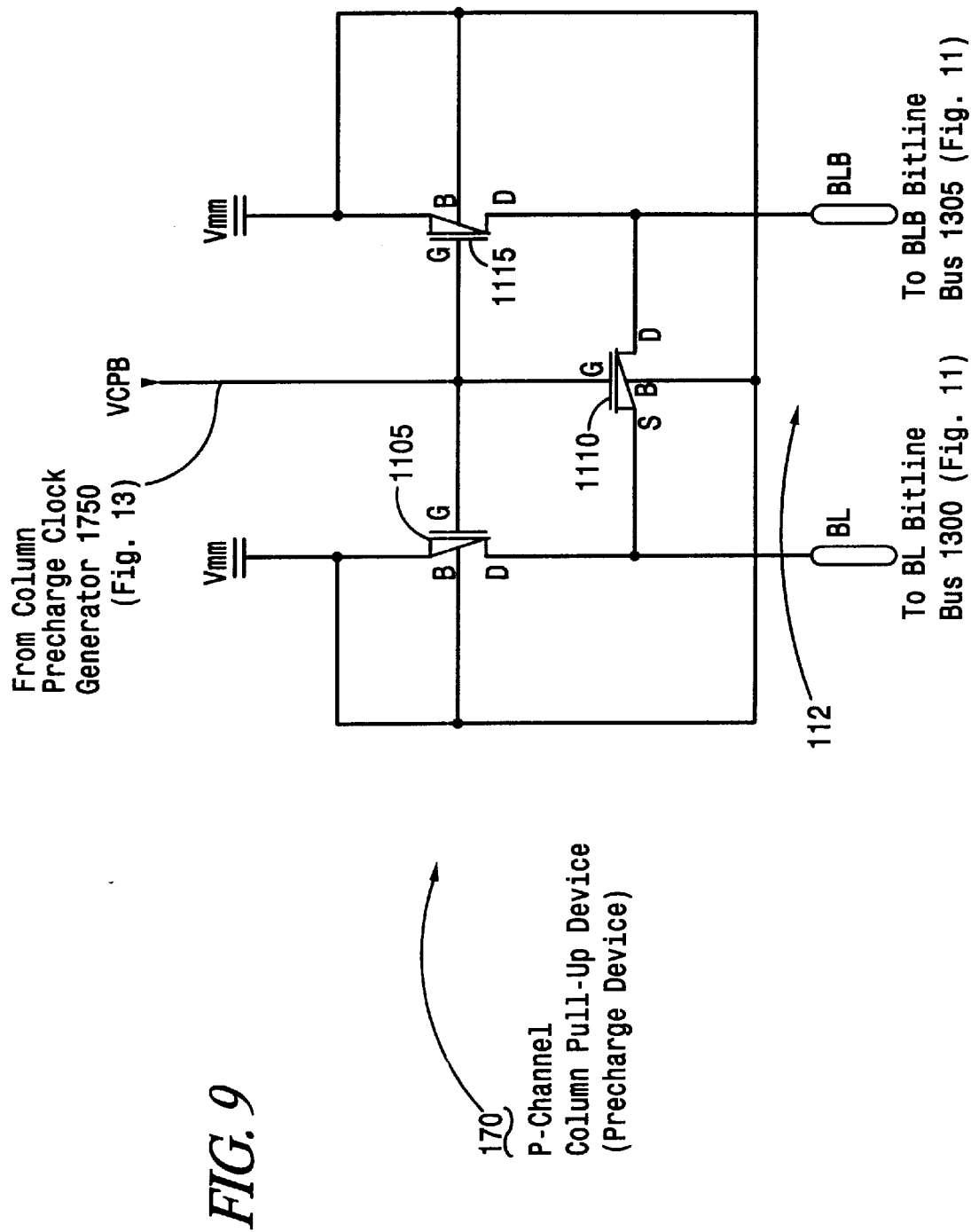
FIG. 9 is a schematic circuit diagram of a p-channel column pull-up device for pulling up the bitlines, BL and BLB, to a positive VMM voltage level.
Figure 10:
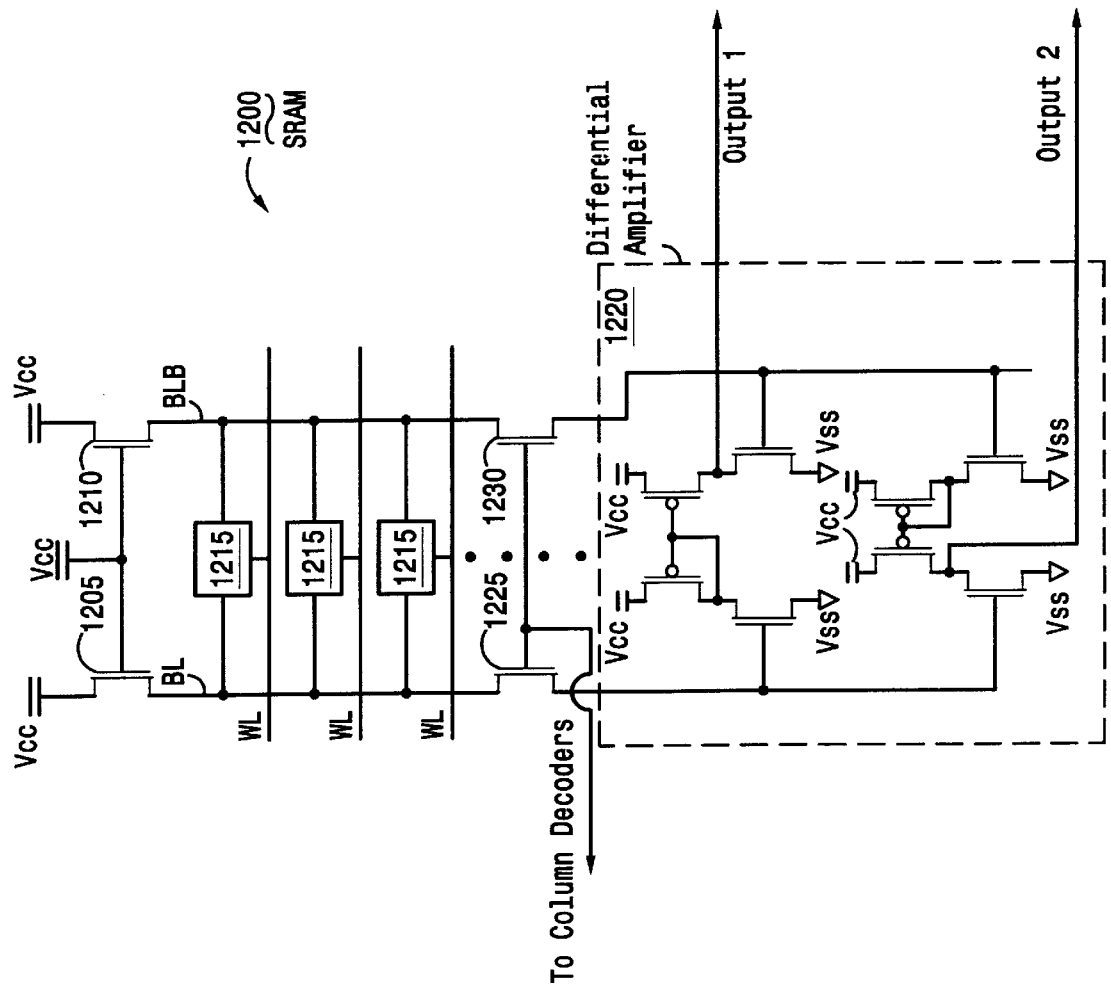
FIG. 10 is a schematic circuit diagram of a conventional SRAM having a differential amplifier for sensing the BL and BLB bitlines pair and constantly charged bitlines pair.

Referring now to FIG. 9, there is seen a schematic circuit diagram of a p-channel column precharge device 170 of FIG. 1. The column precharge device 170 includes p-channel transistors 1105, 1110, and 1115 which have their gates configured to receive the VCPB column precharge clock signal. The p-channel transistors 1105, and 1110 have their sources and bulks connected to the VMM memory voltage source. The drain of the p-channel transistor 1105 is connected to a BL bitline and to the source of the p-channel transistor 1110, while the drain of the p-channel transistor 1110 is connected to a BLB bitline and to the drain of the p-channel transistor 1115. The p-channel transistor 1115 has its bulk connected to the VMM memory voltage source. The low logic VCPB clock signal activates the transistors 1105, 1110, and 1115. Thus, the p-channel transistor 1105 will pull the BL bitline to the VMM voltage level, while the p-channel transistor 1110 will pull the BLB bitline to the VMM voltage level. As a result, the p-channel column pull-up device 170 connects and disconnects the BL and BLB bitlines to the VMM memory voltage source based on the VCPB clock signal. This feature of the present invention increases the operating time for the SRAM device according to the present invention, since the VMM current flow to the BL and BLB bitlines is not continuous as in conventional SRAM devices. For example and as best shown in FIG. 10, a conventional SRAM 1200 has n-channel transistors 1205 and 1210 continuously on since their gates are connected to the VCC supply voltage source. Thus, there is continuous flow of the VCC current to the BL and BLB bitlines, thereby leading to continuous power drain and a decreased operating time for the conventional SRAM 1200.

Figure 11:
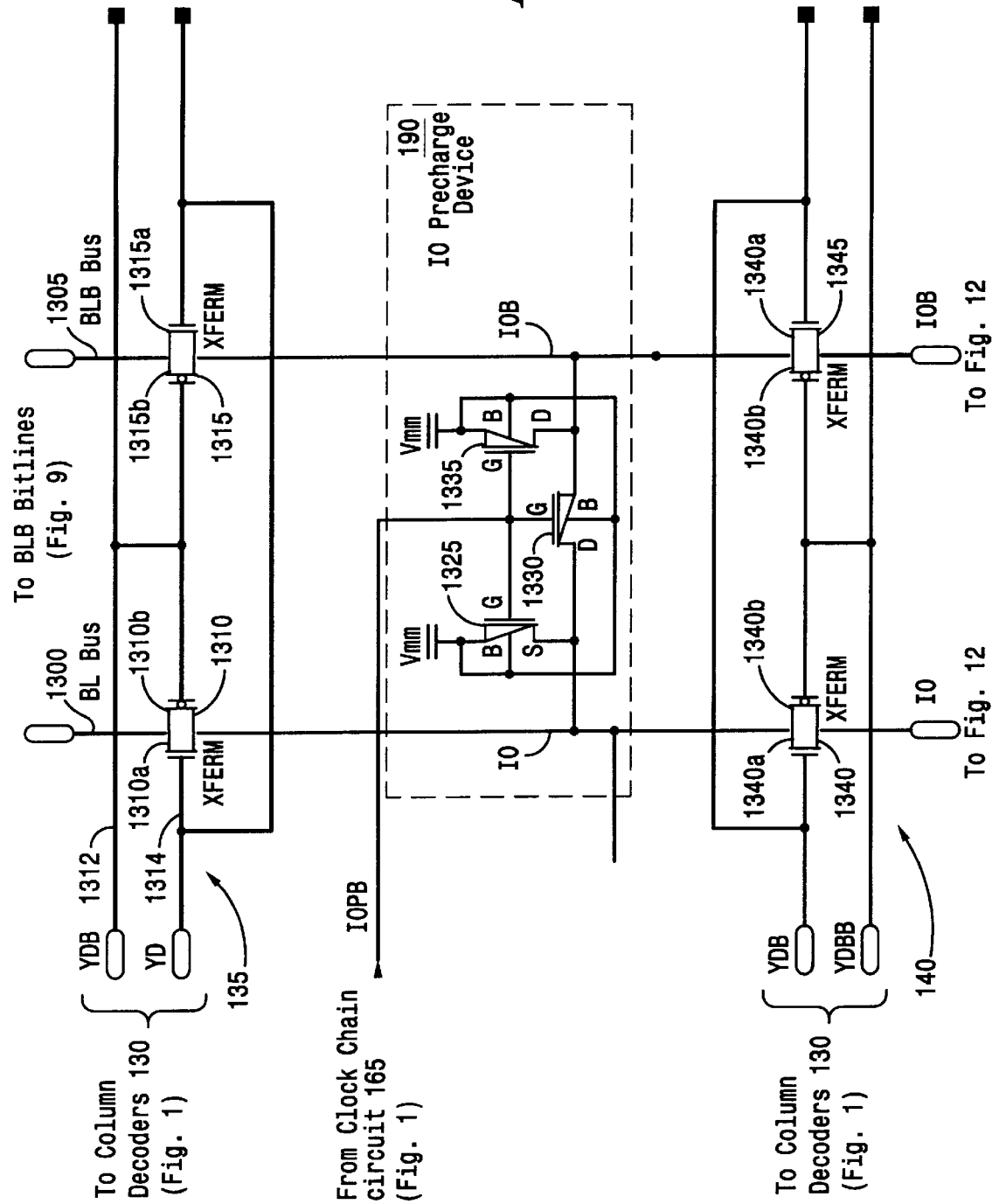
FIG. 11 is a schematic circuit diagram of a column select circuit according to the present invention.

Referring now to FIG. 11, a schematic circuit diagram of the column select devices 135 and 140 of FIG. 1 are shown The column select devices permits a sense amplifier 145 (see FIG. 1) to be coupled to every thirty-two columns wherein each column comprises a BL and BLB bitlines pair. A BL bitline bus 1300 connects to a plurality of BL bitlines, while the BLB bitline bus 1305 connects to plurality of BLB bitlines. Full CMOS transfer device 1310 and 1315 connects the BL bus 1300 and the BLB bus 1305 to the IO and IOB data lines and to the column decoders output buses 1312 and 1314.

The data line precharge device 190 is coupled between an IO data line and an IOB data line. The data line precharge device 190 includes p-channel transistors 1325, 1330, and 1335 which have their gates configured to receive the IOPB clock signal from clock chain circuit 165 (see FIG. 1). The p-channel transistors 1325 and 1335 have their sources and bulks connected to the VMM memory voltage source. The p-channel transistor 1330 has its bulk connected to the VMM memory voltage source. The drain of the transistor 1325 is connected to the drain of the transistor 1330 and to the IO data line, while the drain of the transistor 1335 is connected to the source of the transistor 1330 and to be IOB data line.

The full CMOS transfer devices 1340 and 1345 forms the secondary column select 140 (see FIG. 1) and are also coupled to the column decoders 130 (see FIG. 1 again).

As shown in FIG. 11, the transfer device 1310 comprises an n-channel transistor 1310a coupled to a p-channel transistor 1310b, while the transfer device 1315 comprises an n-channel transistor 1315a coupled to a p-channel transistor 1315b. Similarly, the transfer device 1340 comprises an n-channel transistor 1340a coupled to a p-channel transistor 1340b, while the transfer device 1315 comprises an n-channel transistor 1315a coupled to a p-channel transistor 1315b. The transfer devices 1310, 1315, 1340, and 1345 configuration permit the SRAM of the present invention to operate when VMM is at a very low voltage level (e.g., VMM (VCC) 1.2 volts).

Full CMOS y-select transfer devices (e.g., 1310 and 1315) are used according to the invention for the following reasons. First, during write operations, it is necessary to transfer full VCC (VMM) or VSS (reference) voltages to the bitlines. The NMOS transistor (of a full CMOS y-select transfer device) transfers the VSS voltage, while the PMOS transistor transfers the VCC voltage. If VCC is at about 3.0 volts, then NMOS transfers are acceptable, since the NMOS transistor transfers the full VSS on one bitline, and the voltage (VCC - $V_{TN}$) is transferred on the other bitline. Although the voltage (VCC - $V_{TN}$) is not at the VCC potential, this voltage is high enough to properly write the RAM. As VCC is reduced towards the $V_{TN}$ value, the voltage (VCC - $V_{TN}$) will not be high enough for write operations. According to the second reason, in read operations, during the precharge condition both BL and BLB bitlines are precharged to VCC. Similarly, the IO and IOB lines are precharged to VCC. When the memory cell turns on, one bitline starts to drop, and this is initially transferred to the IO lines by the PMOS device of the full CMOS y-select transfer device. In summary, full CMOS transfer devices are needed at low VCC during a writing operation. PMOS devices are needed at low VCC during a reading operation. At high VCC levels, NMOS transfer devices are sufficient for operations.

In comparison, the conventional SRAM 1200 as shown in FIG. 10 requires the VCC supply voltage to be at higher values during memory operations. Assuming that the n-channel transistors 1225 and 1230 each has a $V_{TN}$ threshold voltage value of 1.0 volt. Thus, if VCC=1.2 volts, a VTN voltage drop of 1.0 volts across the n-channel transistor 1225 will result in a 0.2 volt voltage across the BL bitline, thereby preventing the precharging of the BL bitline.

Figure 12:
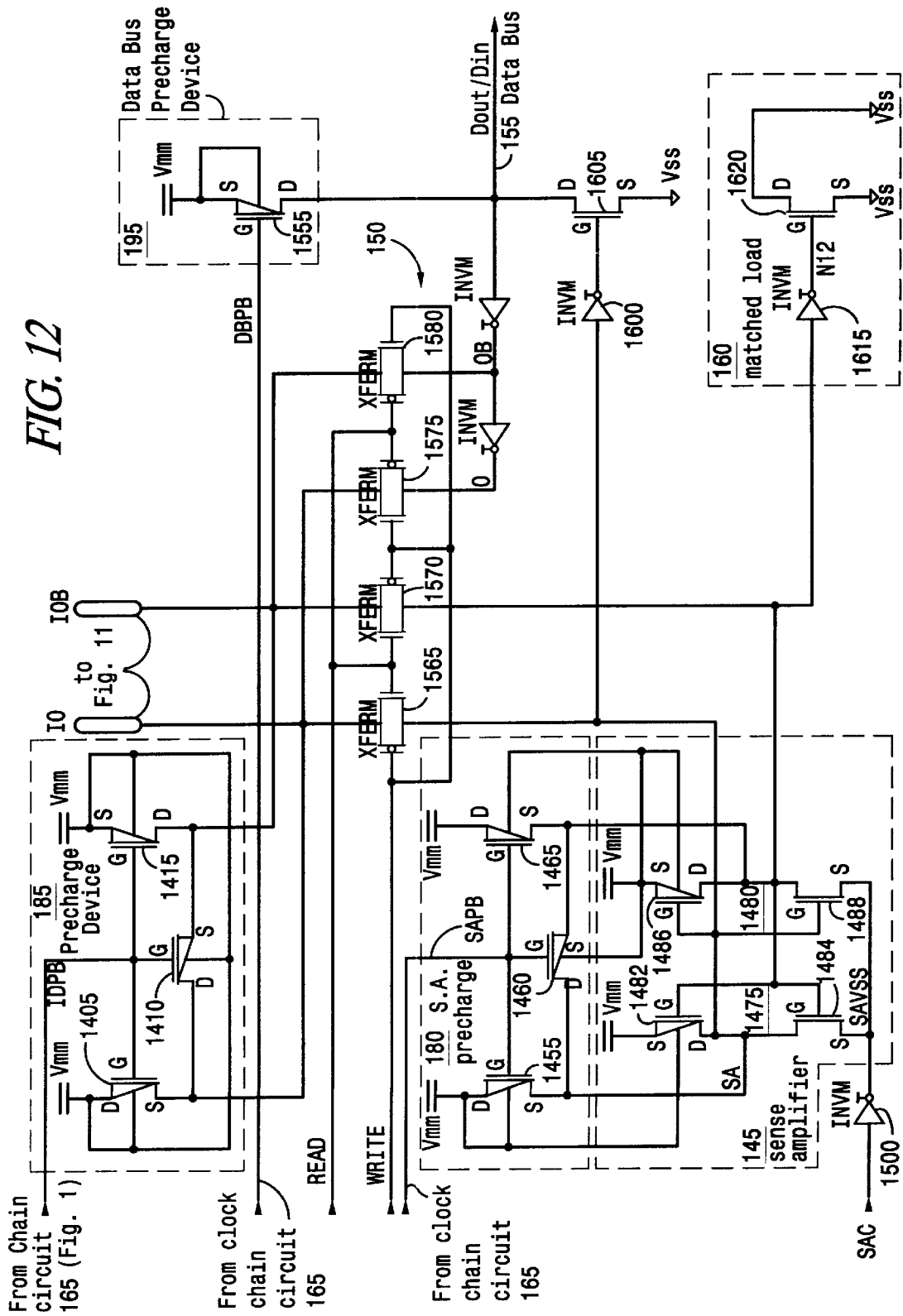
FIG. 12 is a schematic circuit diagram showing the details of the sense amplifier precharge device, the sense amplifier, and the data bus precharge device according to a preferred embodiment of the present invention.

FIG. 12 is a schematic circuit diagram showing additional details of the SRAM device according to the present invention. The precharge device 185 includes the p-channel transistors 1405, 1410, and 1415 and precharges the IO and IOB data lines in response to the IOPB clock. The sense amplifier precharge device 180 includes the p-channel transistors 1455, 1460, and 1465, and precharges the sense amplifier 145 in response to the SAPB clock. The sense amplifier 145 incorporates a latch-type double-ended sensing scheme and includes cross-coupled inverters 1475 and 1480. Because the inverters 1475 and 1480 are cross-coupled, they are latched and stable. The inverters 1475 and 1480 may be designed to have a high common-mode rejection ratio (CMMR), which is the ratio of the response for a normal-mode signal to the response for a common-mode signal of the same amplitude. A high CMMR permits rejection of picked-up interference due to cross-talk from other parts of a system incorporating the present invention.

The inverter 1475 includes a p-channel transistor 1482 and an n-channel transistor 1484. The p-channel transistor 1482 has its source and its bulk connected to VMM, while the n-channel transistor 1484 has its source connected to an output terminal of the inverter 1500. The drains of the p-channel transistor 1482 and of n-channel transistor 1484 are connected together and to the drains of the p-channel transistor 1455 and of p-channel transistor 1460 The gates of the p-channel transistor 1482 and of the n-channel transistor 1484 are connected together and to the IOB data line.

The inverter 1480 includes a p-channel transistor 1486 and an n-channel transistor 1488. The p-channel transistor 1486 has its source and its bulk connected to VMM, while the n-channel transistor 1488 has its source connected to the output terminal of the inverter 1500. The drains of the p-channel transistor 1486 and of the n-channel transistor 1488 are connected together and to the drain of the p-channel transistor 1465. The gates of the p-channel transistor 1486 and of the n-channel transistor 1488 are connected together, and are further connected to the IO data line and to the drains of the p-channel transistor 1482 and of the n-channel transistor 1484.

In order for the sense amplifier 145 to sense bits from a memory cell 110 (FIG. 1) via the BL and BLB bitlines, VMM must either satisfy the condition of Equation (1) or Equation (2).

$$VMM \geq V_{TP} \quad (1)$$

$$VMM \geq |V_{TN}| \quad (2)$$

The $V_{TP}$ voltage is the threshold voltage of the p-channel transistors 1482 or 1486, while the $V_{TN}$ voltage is the threshold voltage of the n-channel transistors 1484 or 1488. Typically, $V_{TP}$ and $|V_{TN}|$ are each at about 0.8 v. When VMM satisfies Equation (1) or Equation (2), the inverters 1475 and 1480 each have sufficient bias voltage to switch in response to the voltages on the BL and BLB bitlines.

According to the invention, VMM can operate as low as about 1.2 v which is based on Equation (3) or Equation (4).

$$VMM \geq V_{TP} + \Delta = 0.8\ v + 0.4\ v = 1.2\ v \quad (3)$$

$$VMM \geq |V_{TN}| + \Delta = 0.8\ v + 0.4\ v = 1.2\ v \quad (4)$$

The $\Delta$ overdrive voltage is typically at about 0.4 volts and can range from about 0.2 v to about 0.4 v.

In comparison, the conventional SRAM 1200, as best shown in FIG. 10, includes a differential amplifier or current mirror 1220 coupled to the BL and BLB bitlines to sense the binary bits ("1" or "0") in the SRAM memory cells 1215. The differential amplifier 1220 requires a bias value as determined by Equation (5).

$$VCC \geq V_{TP} + |V_{TN}| + \Delta \quad (5)$$

If $V_{TP}$=0.8 v, $|V_{TN}|$=0.8 v, and $\Delta$=0.4 v, then VCC will have a value of about=2.0 v. Thus, the conventional SRAM 1200 does not meet the lower bias voltage operating range of the present invention Inverter 1500 has its input terminal for receiving the SAC sense amplifier clock signal from the inverter 1280 (FIG. 11). The SAC clock signal turns on the sense amplifier 145 for sensing the voltages across a BL and BLB bitlines pair.

Bit line sensing circuits are also shown and described in commonly-assigned U.S. patent application Ser. No. 08/886, 616, to Callahan, filed Jul. 1, 1997, entitled ROM BIT SENSING, and including FIGS. 1, 2, 3, and 4 therein; in commonly-assigned U.S. patent application Ser. No. 08/886, 620, to Callahan, filed Jul. 1, 1997, entitled DIGITAL CIRCUIT FOR CONSERVING STATIC CURRENT IN AN ELECTRONIC DEVICE, and including FIGS. 1, 2, 3, 4, 5, 6, 7, 8, 9, 10(a), and 10(b) therein U.S. patent application Ser. Nos. 08/886,616 and 08/886,620 are fully incorporated herein by reference thereto as if repeated verbatim immediately hereinafter.

The data bus precharge device 195 includes a p-channel transistor 1555 with a source and bulk connected to VMM, a drain connected to the data bus 155, and a gate for receiving the DBPB data bus precharge clock signal for turning on the data bus precharge device 195. The write/read control circuit 150 includes the full CMOS transfer devices 1565, 1570, 1575, and 1580. Upon receiving the write enable (WRITE) signal, the write/read control circuit 150 connects the IO and IOB lines to a data input buffer (not shown in Fig, 12) for receiving the input data, $D_{IN}$. In response to the read enable (READ), the control circuit 150 connects the IO and IOB lines to the sense amplifier 145 for sensing the BL and BLB voltage values.

The inverter 1600 with n-channel transistor 1605 are connected to the IO data line, to the drains of the p-channel transistor 1482 and of the n-channel transistor 1484, and to the gates of the p-channel transistor 1486 and of the n-channel transistor 1488. A match load 160 including the inverter 1615 and n-channel transistor 1620 are connected to the gates of the p-channel transistor 1482 and of the n-channel transistor 1484, to the drains of the p-channel transistor 1486 and of the n-channel transistor 1488, and to the IOB data line.

Figure 13:
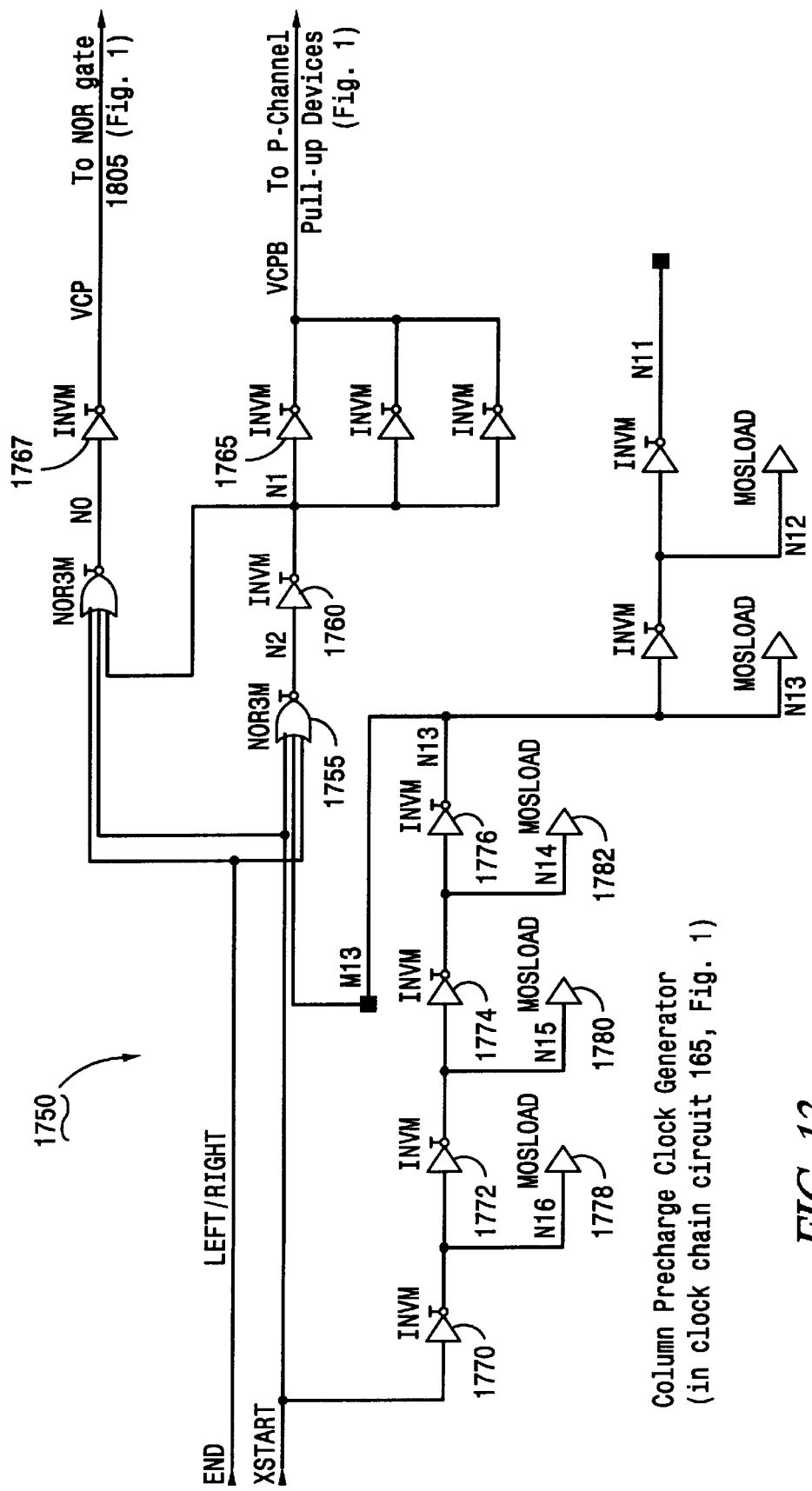
FIG. 13 is a schematic circuit diagram of a column precharge clock generator for generating a VCPB column precharge clock and the VCP clock signal.
Figure 14:
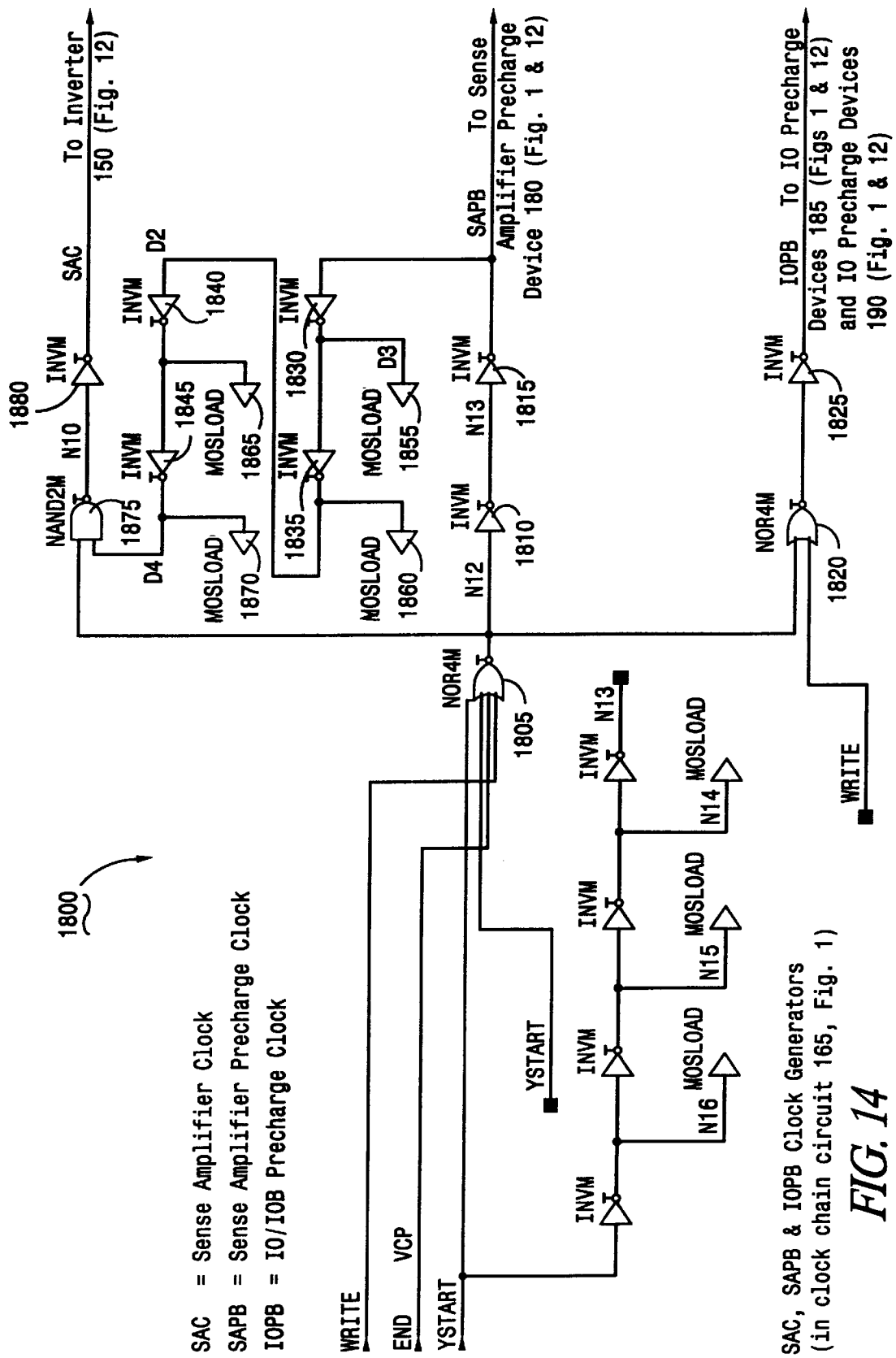
FIG. 14 is a schematic circuit diagram of a clock generator for generating the SAC, SAPB and IOPB clock signals.

FIGS. 13–14 are schematic circuit diagrams of the clock signal generators included in the clock chain circuit 165 according to a preferred embodiment of the present invention. Referring first to FIG. 13, a column precharge clock generator 1750 is shown The generator 1750 outputs the VCP and VCPB clock signals in response to the XSTART clock signal A NOR gate 1755 is configured to receive the XSTART pulse and to output the VCPB column precharge clock signal via inverters pair 1760 and 1765 and the VCP clock signal via inverter 1767. The inverters 1770, 1772, 1774 and 1776 and the loads 1778, 1780 and 1782 form a delay chain which determines the width of the VCPB column precharge clock signal. Alternatively, this delay chain may comprise RC circuits or other suitable components which provide the desired delay.

FIG. 14 shows a clock generator 1800 in the clock chain circuit 165 (see FIG. 1) for generating the following clock signals: the SAPB sense amplifier precharge clock, the SAC sense amplifier clock, and the IOPB precharge clock. The clock generator 1800 includes a NOR gate 1805 configured to receive the WRITE signal, the VCP clock, and the YSTART clock. The output terminal of the NOR gate 1805 drives (via inverters pair 1810 and 1815) the SAPB clock to precharge the sense amplifier precharge device 180 (FIG. 1).

A NOR gate 1820 has a first input terminal connected to the output terminal of the NOR gate 1805, has a second input terminal configured to receive the WRITE signal, and has an output terminal connected via inverter 1825 for generating the IOPB precharge signal for turning on the precharge devices 185 and 190 (see FIG. 1). The inverters 1830, 1835, 1840, and 1845 and the loads 1855, 1860, 1865 and 1870 form a delay chain connected between the output terminal of the inverter 1815 and an input terminal of a NAND gate 1275. Alternatively, this delay chain may comprise RC circuits or other suitable components which provide the desired delay The NAND gate 1875 also has another input terminal connected to the output terminal of the NOR gate 1805. An inverter 1880 has its input terminal connected to the output terminal of the NAND gate 1875 and drives the SAC clock to the inverter 1500 (see FIG. 12).

Figure 15:
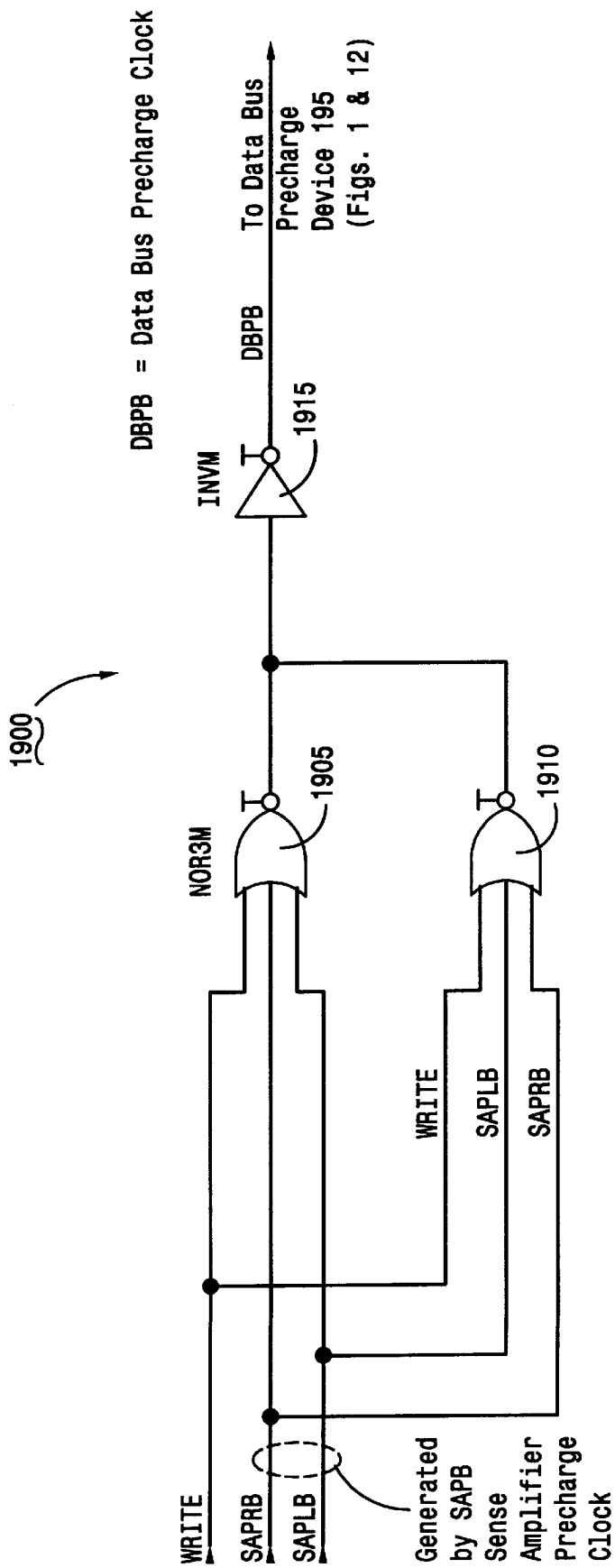
FIG. 15 is a schematic circuit diagram of a data bus precharge clock generator for generating a DBPB data bus precharge clock.

FIG. 15 shows a data bus precharge clock generator 1900 for generating the DBPB data bus precharge clock. The NOR gates pair 1905 and 1910 are configured to receive the WRITE signal and the SAPRB and SAPLB signals which are generated from the SAPB sense amplifier precharge clock. When the WRITE signal, the SAPRB clock, and SAPLB clock are low, node 1912 will be high. Thus the inverter 1915 outputs the low logic DBPB bus signal for precharging the data bus precharge device 195. During a write operation to the memory cell array 105, the WRITE signal will be high. Thus, the node 1912 will be low. Thus the DBPB clock signal will be high, thereby turning off the data bus precharge device 195 during a write operation.

OPERATION OF THE INVENTION

Figure 16:
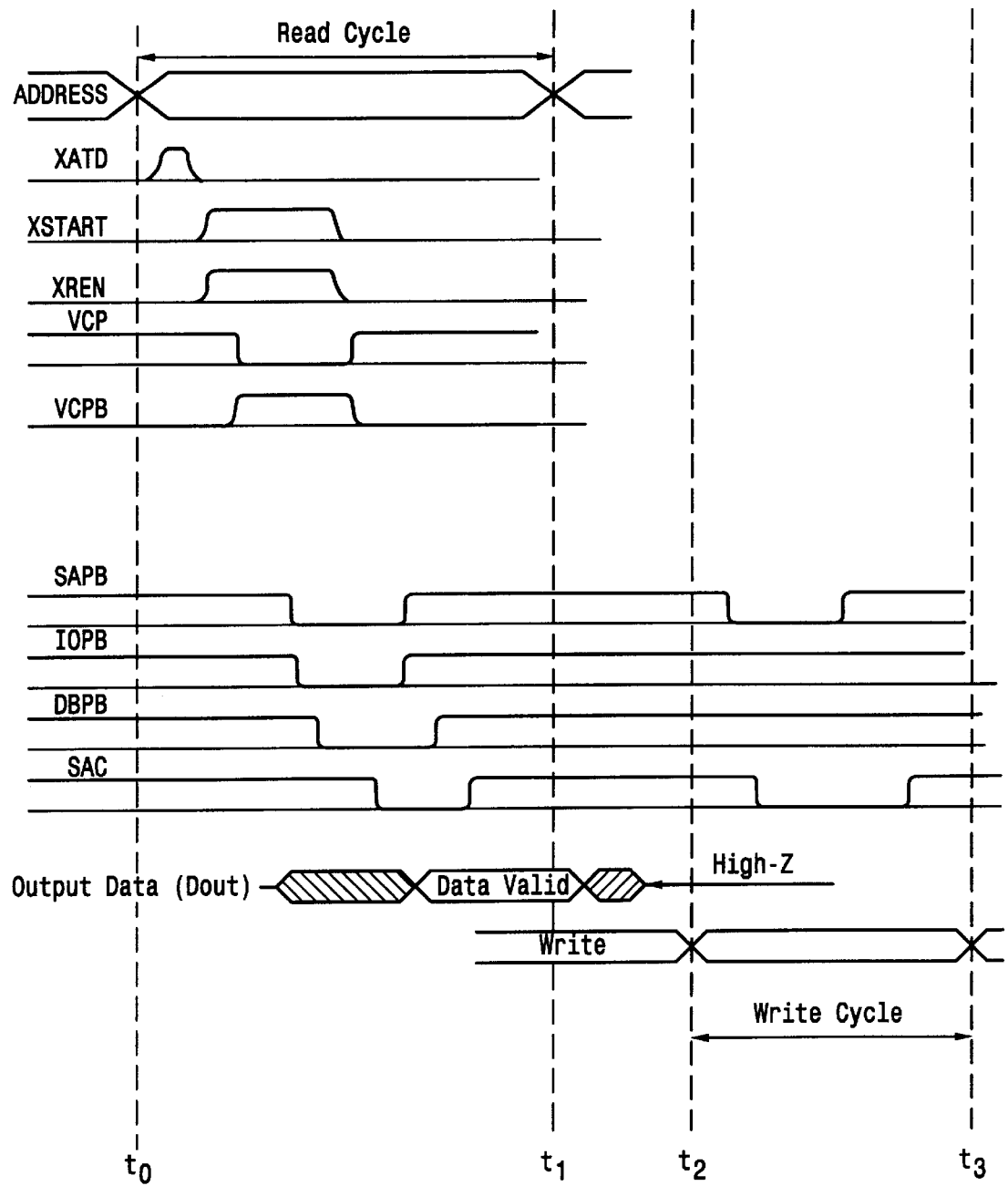
FIG. 16 is an embodiment of a timing diagram for showing a method of operation of a low-power/low voltage memory according to the present invention.

FIG. 16 shows timing diagrams which illustrate one embodiment of a method of operation of the low voltage and low power SRAM according to the present invention. At time t0, a transition in the XADDRESS row address signal occurs and is detected by the row address buffers stage 115 (see FIG. 1). The XADDRESS-signal transition generates the XATD row address transition pulse which is then driven into the clock chain circuit 165 (FIG. 1). A plurality of XATD signals might generate and are wired-OR by the wired-OR gate 270 (FIG. 2) to generate an initial clock, XSTART. The XSTART clock also generates the XREN clock signal which is driven into the row decoder stage 120 (FIG. 1) for pulling down the WL wordlines (see FIG. 1 again) prior to or during precharging of the BL and BLB bitlines pairs (see FIG. 1 again).

The XSTART clock generates the VCPB clock which turns on the column precharge devices 170 (FIG. 1). In addition, the XSTART clock generates the VCP clock which is driven from the inverter 1767 (FIG. 13) to the NOR gate 1805 (FIG. 14) to generate the SAPB clock, the SAC clock, and the IOPB clock (when the WRITE signal low). The SAPB clock precharges the sense amplifier precharge device 180 (FIG. 1). The SAC clock turns on the sense amplifier 145 (FIG. 1)D The IOPB clock turns on the precharge devices 185 and 190 (FIG. 1) for precharging the IO and IOB data lines (see FIG. 1 again). The SAPB clock also generates the DBPB clock for turning on the data bus precharge device 195 (FIG. 1) when the WRITE signal is low. Output data, $D_{OUT}$, is read from the data bus 155 (FIG. 1).

At time t2, a write cycle initiates. The high WRITE signal driven into NOR gate 1820 (FIG. 14) results in a low NOR gate 1820 output. This high NOR gate 1820 output is inverted by inverter 1825 into a high IOPB output, as shown in FIG. 16. The high WRITE signal drives the node 1912 (FIG. 15) low, thereby resulting in a high DBPB clock output, as also shown in FIG. 15. The high WRITE signal is also driven into NOR gate 1805 (FIG. 14) which outputs a low SAPB clock (via inverters 1810 and 1815) and a low SAC clock from inverter 1880 (FIG. 14). The low SAPB and SAC clock signals are best illustrated in FIG. 16.

Figure 17:
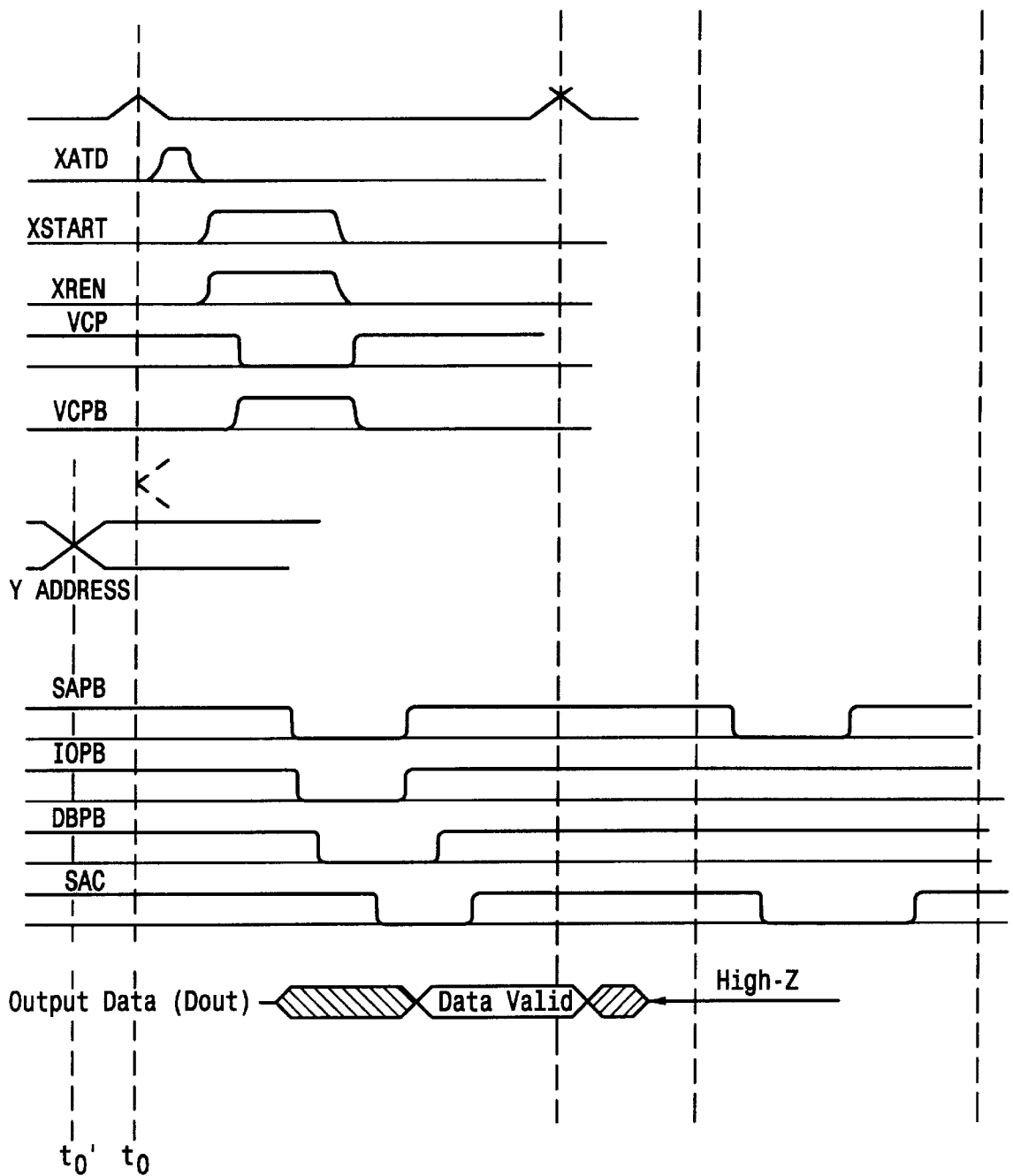
FIG. 17 is another embodiment of the timing diagram for showing a method of operation of a low-power/low voltage memory according to the present invention.

Referring now to FIG. 17, there is seen timing diagrams which illustrate a second embodiment of a method of operation of the low voltage and low power SRAM according to the present invention. As in FIG. 16, the XADRESS transition at time t0 triggers the XATD address transition pulse, which then triggers the XSTART clock. As stated above, the XSTART clock triggers the XREN, VCP and VCPB clocks.

At time t0', a transition in the YADDRESS column address signal occurs and is detected by the column address buffers stage 125 (see FIG. 1). The YADDRESS signal transition generates the YATD column address transition pulse which is then driven into the clock chain circuit 165 (FIG. 1). A plurality of YATD signals might generate and are wired-OR by the wired-OR gate 370 (FIG. 3) to generate an initial clock, YSTART. The YSTART clock also generates the YCLKB clock signal which is driven into the column decoder stage 130 (FIG. 1) for pulling down the columns 112 (see FIG. 1 again) prior to or during precharging of the BL and BLB bitlines pairs (see FIG. 1 again).

The YSTART clock is driven into the NOR gate 1805 (FIG. 14) to generate the SAPB clock, the SAC clock, and the IOPB clock (when the WRITE signal low). As stated above, the SAPB clock also generates the DBPB clock for turning on the data bus precharge device 195 (FIG. 1) when the WRITE signal is low.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth.

I claim:

1. A low voltage and low power static random access memory (SRAM) comprising:

an address decoding circuit for receiving an address of said SRAM and for generating address decoding circuit output signals:

a memory cell array comprising a plurality of memory cells coupled to a plurality of wordlines and to a plurality of bitline pairs, each of said bitline pairs having a first bitline line and a second bitline line:

a sense amplifier circuit;

an I/O circuit; and a clock chain circuit for receiving said address decoding circuit output signals and for providing a plurality of control signals and a plurality of precharge signals;

wherein said control signals and said precharge signals control said address decoding circuit, said memory cell array, said sense amplifier circuit, and said I/O circuit:

said sense amplifier circuit comprises a sense amplifier precharge device for receiving a first (SAPB) of said precharge signals and for providing sense amplifier precharge device output signals; and a sense amplifier for receiving a first (SAC) of said control signals and said sense amplifier precharge device output signals, and for providing sense amplifier output signals:

said sense amplifier precharge device comprises p-channel transistors for receiving said first (SPAB) precharge signal, a first logic level of said first precharge signal activates said transistors, and a second logic level of said first precharge signal deactivates said transistors; and a first of said p-channel transistors has a first source, a first drain, a first gate, and a first bulk;

a second of said p-channel transistors has a second source, a second drain, a second gate, and a second bulk;

a third of said p-channel transistors has a third source, a third drain, a third gate and a third bulk; and said first gate, said second gate, and said third gate are connected for receiving said first (SAPB) precharge signal; said first source, said third source, said first bulk, said second bulk, and said third bulk are connected to a memory voltage source; said first drain is coupled to said second source for providing a first of said sense amplifier precharge device output signals; and said second drain is coupled to said third drain for providing a second of said sense amplifier precharge device output signals.

2. The SRAM of claim 1 wherein said sense amplifier comprises cross-coupled inverters for receiving said sense amplifier precharge device output signals and for allowing said SRAM to operate at low voltage.

3. The SRAM of claim 2 wherein:
   a first of said cross-coupled inverters has
      a first inverter p-channel transistor including a first inverter p source, a first inverter p drain, a first inverter p gate, and a first inverter p bulk;
      a first inverter n-channel transistor including a first inverter n source, a first inverter n drain, and a first inverter n gate; and
   a second of said cross-coupled inverters has
      a second inverter p-channel transistor including a second inverter p source, a second inverter p drain, a second inverter p gate, and a second inverter p bulk;
      a second inverter n-channel transistor including a second inverter n source, a second inverter n drain, and a second inverter n gate; and
   said first inverter p drain is connected to said first inverter n drain for receiving said first sense amplifier output signal; said second inverter p drain is connected to said second inverter n drain for receiving said second sense amplifier output signal; said first inverter n source is connected to said second inverter n source for receiving said first (SAC) control signal; said first inverter p gate is connected to said first inverter n gate; said second inverter p gate is connected to said second inverter n gate; and said first inverter p bulk, said second inverter p bulk, said first inverter p source, and said second inverter p source are connected to a memory voltage source.

4. A low voltage and low power static random access memory (SRAM) comprising:
   an address decoding circuit for receiving an address of said SRAM and for generating address decoding circuit output signals;
   a memory cell array comprising a plurality of memory cells coupled to a plurality of wordlines and to a plurality of bitline pairs, each of said bitline pairs having a first bitline line and a second bitline line;
   a sense amplifier circuit;
   an I/O circuit; and
   a clock chain circuit for receiving said address decoding circuit output signals and for providing a plurality of control signals and a plurality of precharge signals;
   wherein said control signals and said precharge signals control said address decoding circuit, said memory cell array said sense amplifier circuit and said I/O circuit
   said memory cell array further comprises a plurality of bitline precharge devices for receiving a second (VCPB) of said precharge signals;
   each of said bitline precharge devices comprises P-channel transistors for receiving said second (VCPB) precharge signal, a first logic level of said second precharge signal activates said transistors, and a second logic level of said second precharge signal deactivates said transistors;

a first of said p-channel transistors has a first source, a first drain, a first gate, and a first bulk;
a second of said p-channel transistors has a second source, a second drain, a second gate, and a second bulk;
a third of said p-channel transistors has a third source, a third drain, a third gate and a third bulk; and
said first gate, said second gate, and said third gate are connected for receiving said second (VCPB) precharge signal; said first source, said third source, said first bulk, said second bulk, and said third bulk are connected to a memory voltage source, said first drain is coupled to said second source for providing a first bitline precharge output signal; and said second drain is coupled to said third drain for providing a second bitline precharge output signal.

5. The SRAM of claim 4 wherein said first bitline precharge output signal and said second bitline precharge output signal control a pair of said bitline pairs.

6. The SRAM of claim 5 wherein said bitline precharge devices, based on said second precharge signal, connect or disconnect a plurality of said bitline pairs to a memory voltage source, thereby allowing said SRAM to consume less power.

7. A low voltage and low power static random access memory (SRAM) comprising:
   an address decoding circuit for receiving an address of said SRAM and for generating address decoding circuit output signals;
   a memory cell array comprising a plurality of memory cells coupled to a plurality of wordlines and to a plurality of bitline pairs, each of said bitline pairs having a first bitline line and a second bitline line;
   a sense amplifier circuit;
   an I/O circuit; and
   a clock chain circuit for receiving said address decoding circuit output signals and for providing a plurality of control signals and a plurality of precharge signals;
   wherein said control signals and said precharge signals control said address decoding circuit, said memory cell array, said sense amplifier circuit, and said I/O circuit;
   said I/O circuit comprises
      at least one column select device for receiving a plurality of decoding circuit output signals and for connecting to a plurality of said bitline pairs and a plurality of I/O pairs, each I/O pair having a first I/O line and a second I/O line;
      at least one I/O precharge device for receiving a third (IOPB) of said precharge signals and for connecting to said I/O pairs;
      a data bus precharge device for receiving a fourth (DBPB) of said precharge signals and for connecting to a plurality of databus; and
      a write-read control circuit coupled to said sense amplifier circuit and a plurality of said I/O pairs.

8. The SRAM of claim 7 wherein each of said column select devices comprises:
   full CMOS transfer devices, each of said transfer devices including
      a PMOS device having a p gate, a p source, and a p drain; and
      an NMOS device having an n gate, an n source, and an n drain;
   wherein said p drain is coupled to said n drain for providing a first transfer device output terminal, said p source is coupled to said n source for providing second transfer device output terminal, said p gate serves as a third transfer device output terminal, and said n gate serves as a fourth transfer device output terminal.

9. The SRAM of claim 8 wherein said NMOS device is active during a write operation, and said PMOS device is active during a read operation.

10. The SRAM of claim 8 wherein said CMOS transfer devices permit said SRAM to operate at a low voltage.

11. The SRAM of claim 10 wherein said first transfer device output terminal is coupled to a first bitline of one of said bitline pairs, said second transfer device output terminal is coupled to an I/O line of one of said I/O pairs, and said third transfer device output terminal and said fourth transfer device output terminal are coupled to said address decoding circuit.

12. The SRAM of claim 11 wherein a third transfer device output terminal of a first transfer device is coupled to a third transfer device output terminal of a second transfer device.

13. The SRAM of claim 8 wherein each of said I/O precharge devices comprises p-channel transistors for receiving said third (IOPB) precharge signal, a first logic level of said third precharge signal activates said transistors, and a second logic level of said third precharge signal deactivates said transistors.

14. The SRAM of claim 13 wherein:

a first of said p-channel transistors has a first source, a first drain, a first gate, and a first bulk;

a second of said p-channel transistors has a second source, a second drain, a second gate, and a second bulk;

a third of said p-channel transistors has a third source, a third drain, a third gate and a third bulk;

said first gate, said second gate, and said third gate are connected for receiving said third (IOPB) precharge signal; said first source, said third source, said first bulk, said second bulk, and said third bulk are connected to a memory voltage source; said first drain is coupled to said second source for providing a first I/O precharge output signal terminal; and said second drain is coupled to said third drain for providing a second I/O precharge output signal terminal.

15. The SRAM of claim 14 wherein said first I/O precharge output signal terminal of one of said precharge devices is coupled to said first transfer output signal terminal of one of said transfer devices, and said second I/O precharge output signal terminal of one of said precharge devices is coupled to said second transfer output signal terminal of one of said transfer devices.

16. The SRAM of claim 15 wherein said address decoding circuit comprises:

a row address buffer for receiving row addresses of said SRAM and for providing row address buffer output signals;

a row address decoder for receiving a second (XREN) control signal and said row address buffer output signals;

a column address buffer for receiving column addresses of said SRAM and for providing column address buffer output signals; and a column address decoder for receiving a third (YCLKB) of said control signals and said column address buffer output signals and for providing column address decoder output signals.

17. The SRAM of claim 16 wherein said second control signal controls a plurality of said wordlines.

18. A precharge device for use in a memory device having a plurality of bitline pairs, each of said bitline pairs including a first bitline and a second bitline, said precharge device comprising:

a first p-channel transistor having a first source, a first drain, a first gate, and a first bulk;

a second p-channel transistor having a second source, a second drain, a second gate, and a second bulk; and a third p-channel transistor having a third source, a third drain, a third gate and a third bulk;

wherein said first gate, said second gate, and said third gate receive a clocking signal; said first source, said third source, said first bulk, said second bulk, and said third bulk are connected a voltage source; said first drain is coupled to said second source for providing a first precharge device terminal; and said second drain is coupled to said third drain for providing a second precharge device terminal.

19. The precharge device of claim 18 wherein said first precharge device terminal is coupled to said first bitline and said second precharge device terminal is coupled to said second bitline.

20. The precharge device of claim 18 wherein said first precharge device terminal is coupled to a first sense amplifer terminal and said second precharge device terminal is coupled to a second sense amplifier terminal.

21. A sense amplifier circuit for use in a memory device, comprising:

a sense amplifier precharge device for receiving a precharge signal and for providing sense amplifier precharge device output signals; and a sense amplifier for receiving a control signal and said sense amplifier precharge device output signals and for providing sense amplifier output signals;

wherein said sense amplifier precharge device comprises p-channel transistors for receiving said precharge signal, a first logic level of said precharge signal activates said transistors, a second logic level of said precharge signal deactivates said transistors.

22. The sense amplifier circuit of claim 21 wherein said sense amplifier comprises cross-coupled inverters for receiving said sense amplifier precharge device output signals.

23. The sense amplifier circuit of claim 22 wherein:

a first of said cross-coupled inverters has a first inverter p-channel transistor including a first inverter p source, a first inverter p drain, a first inverter p gate, and a first inverter p bulk;

a first inverter n-channel transistor including a first inverter n source, a first inverter n drain, and a first inverter n gate;

a second of said cross-coupled inverters has a second inverter p-channel transistor including a second inverter p source, a second inverter p drain, a second inverter p gate, and a second inverter p bulk;

a second inverter n-channel transistor including a second inverter n source, a second inverter n drain, and a second inverter n gate; and said first inverter p drain is connected to said first inverter n drain for receiving said first sense amplifier output signal; said second inverter p drain is connected to said second inverter n drain for receiving said second sense amplifier output signal; said first inverter n source is connected to said second inverter n source for receiving said control signal; said first inverter p gate is connected to said first inverter n gate; said second inverter p gate is connected to said second inverter n gate; and said first inverter p bulk, said second inverter p bulk, said first inverter p source, and said second inverter p source are connected to a memory voltage source.

* * * * *